US012283552B2

(12) United States Patent
Shen et al.

(10) Patent No.: US 12,283,552 B2
(45) Date of Patent: Apr. 22, 2025

(54) EXTENDED SEAL RING STRUCTURE ON WAFER-STACKING

(71) Applicant: Taiwan Semiconductor Manufacturing Co., Ltd., Hsinchu (TW)

(72) Inventors: Shih-Hsorng Shen, Hsinchu (TW); Kuan-Hsien Lee, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 261 days.

(21) Appl. No.: 17/872,809

(22) Filed: Jul. 25, 2022

(65) Prior Publication Data

US 2022/0359429 A1 Nov. 10, 2022

Related U.S. Application Data

(62) Division of application No. 17/150,871, filed on Jan. 15, 2021, now Pat. No. 11,894,319.

(60) Provisional application No. 63/058,623, filed on Jul. 30, 2020.

(51) Int. Cl.
| | |
|---|---|
| *H01L 21/768* | (2006.01) |
| *H01L 21/78* | (2006.01) |
| *H01L 23/00* | (2006.01) |
| *H01L 23/31* | (2006.01) |
| *H01L 23/58* | (2006.01) |
| *H01L 25/00* | (2006.01) |
| *H01L 25/065* | (2023.01) |

(52) U.S. Cl.
CPC ............ *H01L 23/562* (2013.01); *H01L 21/78* (2013.01); *H01L 23/564* (2013.01); *H01L 23/585* (2013.01); *H01L 24/08* (2013.01); *H01L 24/80* (2013.01); *H01L 25/0657* (2013.01); *H01L 25/50* (2013.01); *H01L 2224/08145* (2013.01); *H01L 2224/80895* (2013.01); *H01L 2224/80896* (2013.01); *H01L 2924/3511* (2013.01)

(58) Field of Classification Search
CPC .. H01L 23/585; H01L 25/0657; H01L 23/562
See application file for complete search history.

(56) References Cited

U.S. PATENT DOCUMENTS

| | | | |
|---|---|---|---|
| 8,742,596 | B2 | 6/2014 | Hirano |
| 9,305,968 | B2 | 4/2016 | Qian et al. |
| 9,540,230 | B2 | 1/2017 | Daneman et al. |
| 9,650,243 | B2 | 5/2017 | Chen et al. |
| 9,972,603 | B2 | 5/2018 | Chu et al. |
| 2010/0078769 | A1 | 4/2010 | West et al. |
| 2011/0193197 | A1 | 8/2011 | Farooq et al. |

(Continued)

FOREIGN PATENT DOCUMENTS

| | | |
|---|---|---|
| KR | 20140038860 A | 3/2014 |
| TW | 202005036 A | 1/2020 |

*Primary Examiner* — Kyoung Lee
*Assistant Examiner* — David J Goodwin
(74) *Attorney, Agent, or Firm* — Slater Matsil, LLP

(57) ABSTRACT

Embodiments include a wafer-on-wafer bonding where each wafer includes a seal ring structure around die areas defined in the wafer. Embodiments provide a further seal ring spanning the interface between the wafers. Embodiments may extend the existing seal rings of the wafers, provide an extended seal ring structure separate from the existing seal rings of the wafers, or combinations thereof.

20 Claims, 41 Drawing Sheets

(56) References Cited

U.S. PATENT DOCUMENTS

| | | | |
|---|---|---|---|
| 2012/0241981 A1* | 9/2012 | Hirano | H01L 23/562 |
| | | | 257/777 |
| 2014/0117546 A1* | 5/2014 | Liu | H01L 25/0657 |
| | | | 438/669 |
| 2015/0069609 A1 | 3/2015 | Farooq et al. | |
| 2015/0129190 A1 | 5/2015 | Lin | |
| 2015/0194455 A1* | 7/2015 | Ho | H01L 27/14636 |
| | | | 438/109 |
| 2017/0186732 A1* | 6/2017 | Chu | H01L 24/24 |
| 2019/0164914 A1 | 5/2019 | Hu et al. | |
| 2019/0287932 A1 | 9/2019 | Hu et al. | |
| 2019/0319007 A1 | 10/2019 | Uzoh et al. | |
| 2019/0363079 A1 | 11/2019 | Thei et al. | |
| 2020/0035641 A1 | 1/2020 | Fountain, Jr. et al. | |
| 2021/0287957 A1 | 9/2021 | Lin et al. | |

\* cited by examiner

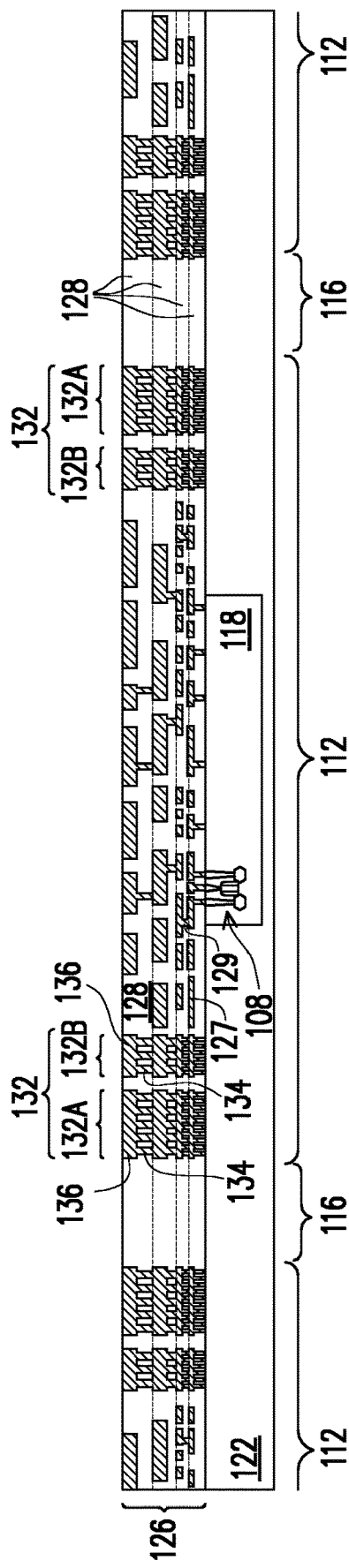
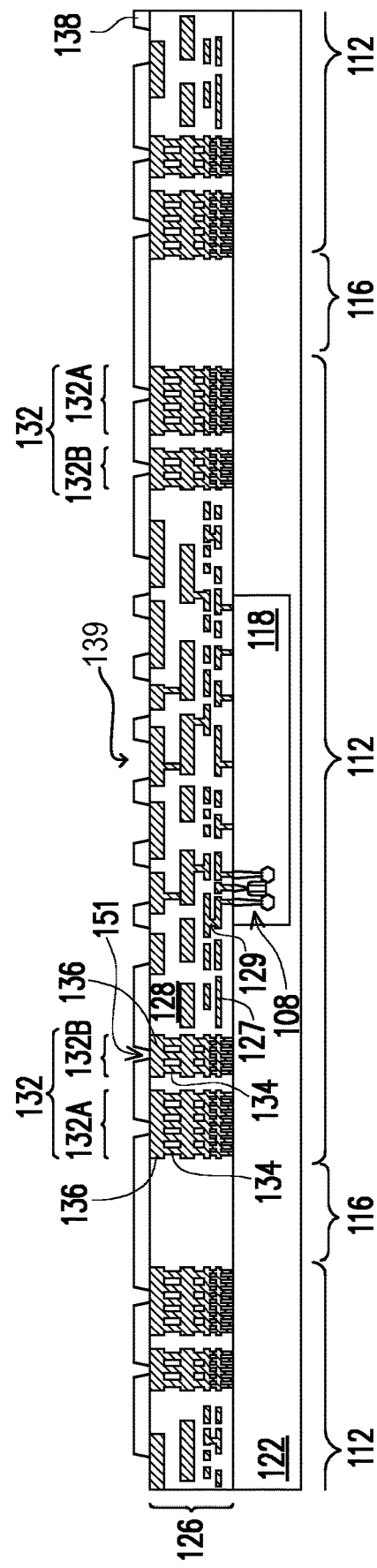
FIG. 2
FIG. 3

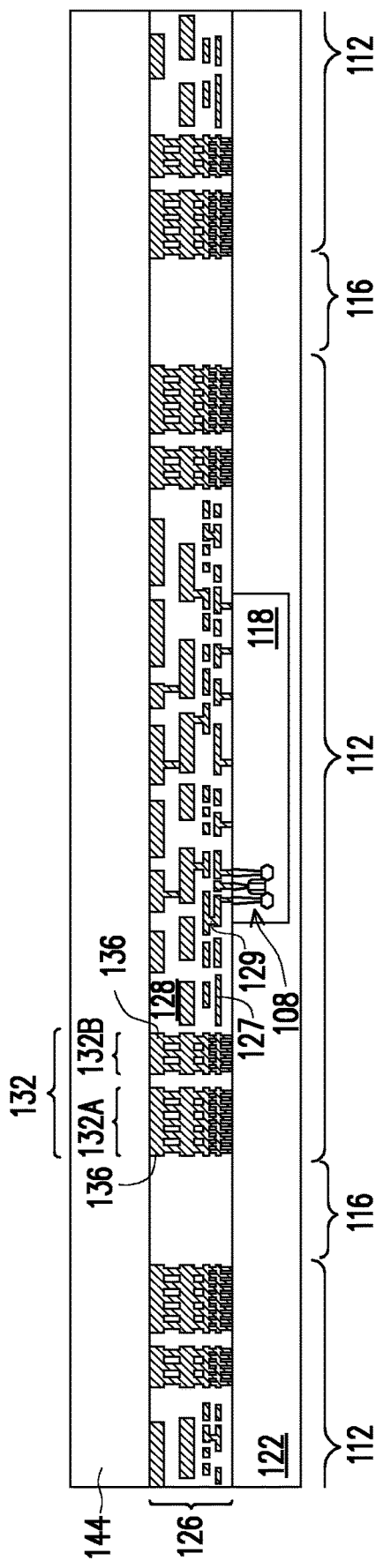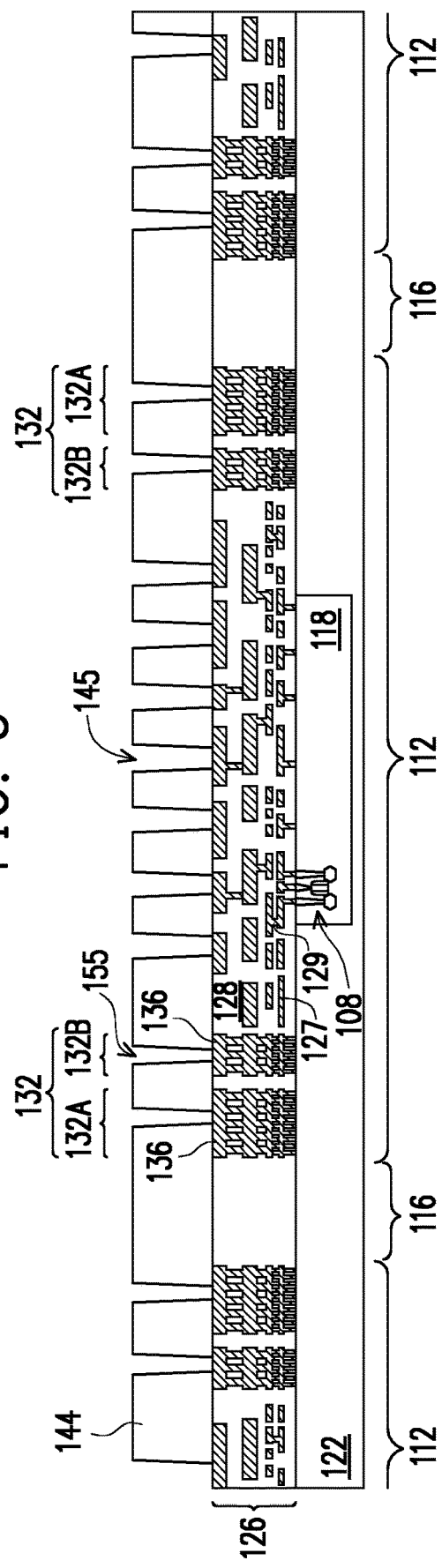

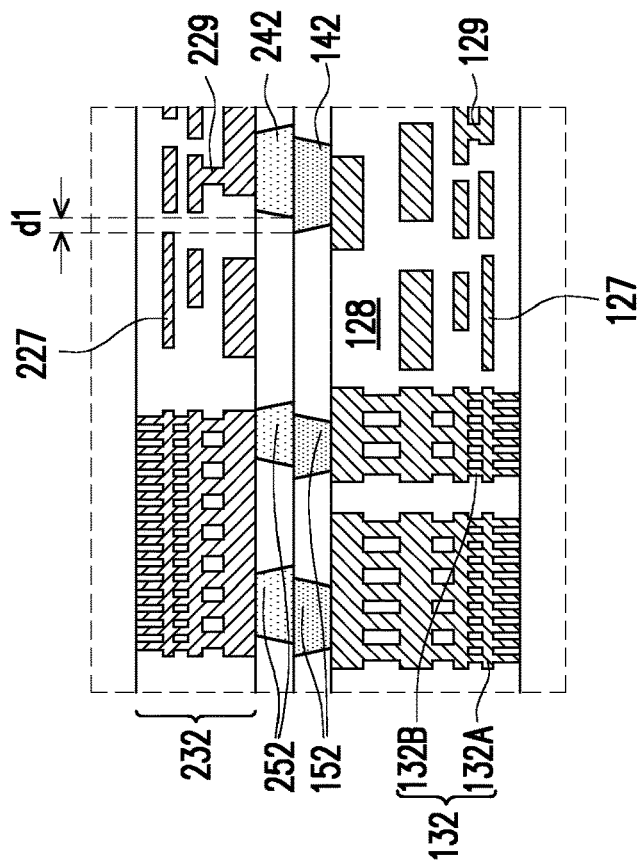
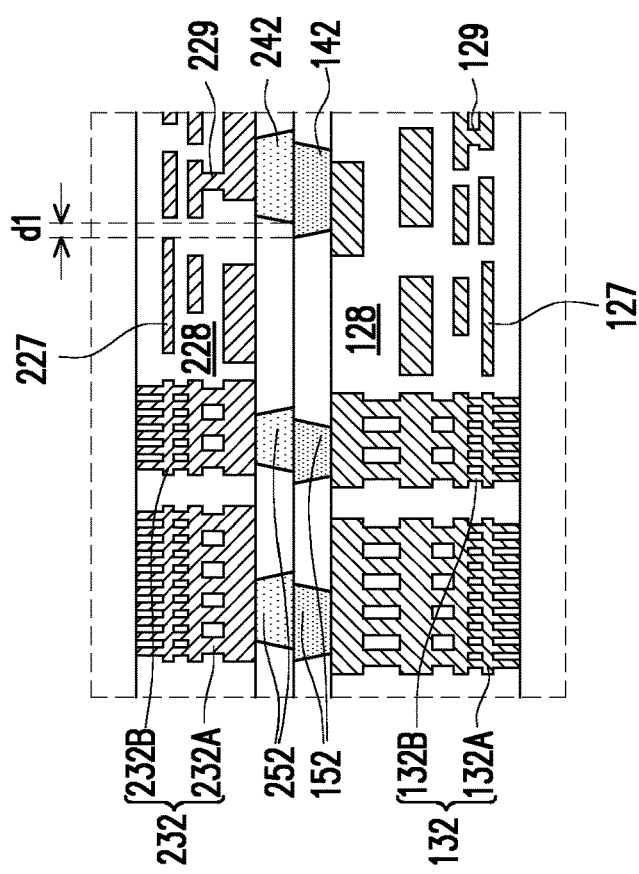

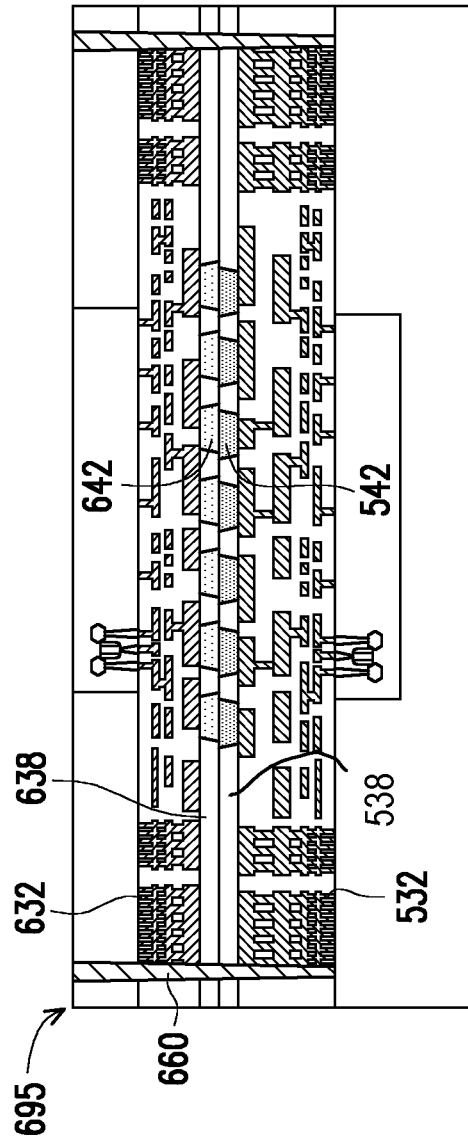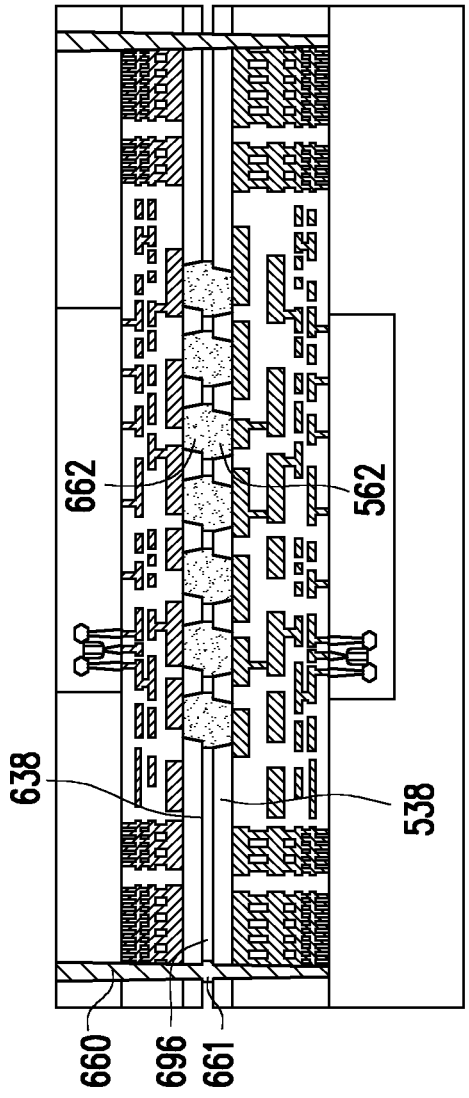

EXTENDED SEAL RING STRUCTURE ON WAFER-STACKING

PRIORITY CLAIM AND CROSS-REFERENCE

This application is a divisional of application Ser. No. 17/150,871, filed Jan. 15, 2021, now U.S. Pat. No. 11,894,319, issued Feb. 6, 2024, which claims the benefit of U.S. Provisional Application No. 63/058,623, filed on Jul. 30, 2020, which applications are hereby incorporated herein by reference.

BACKGROUND

In wafer-to-wafer bonding technology, various methods have been developed to bond two package components (such as wafers) together. The available bonding methods include fusion bonding, eutectic bonding, direct metal bonding, hybrid bonding, and the like. In the fusion bonding, an oxide surface of a wafer is bonded to an oxide surface or a silicon surface of another wafer. In the eutectic bonding, two eutectic materials are placed together, and are applied with a high pressure and a high temperature. The eutectic materials are hence molten. When the melted eutectic materials are solidified, the wafers are bonded together. In the direct metal-to-metal bonding, two metal pads are pressed against each other at an elevated temperature, and the inter-diffusion of the metal pads causes the bonding of the metal pads. In the hybrid bonding, the metal pads of two wafers are bonded to each other through direct metal-to-metal bonding, and an oxide surface of one of the two wafers is bonded to an oxide surface or a silicon surface of the other wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 7 illustrate various views of intermediate steps of forming a seal ring extension, in accordance with some embodiments.

FIGS. 8 through 12 illustrate various views of intermediate steps of forming a seal ring extension including a seal ring extension via, in accordance with some embodiments.

FIGS. 15 through 19 illustrate various views of intermediate steps of forming a seal ring extension through a wafer stack and device package, in accordance with some embodiments.

FIGS. 35 through 40 illustrate various views of intermediate steps of forming a seal ring extension through a wafer stack and device package, in accordance with some embodiments.

DETAILED DESCRIPTION

Figure 1:
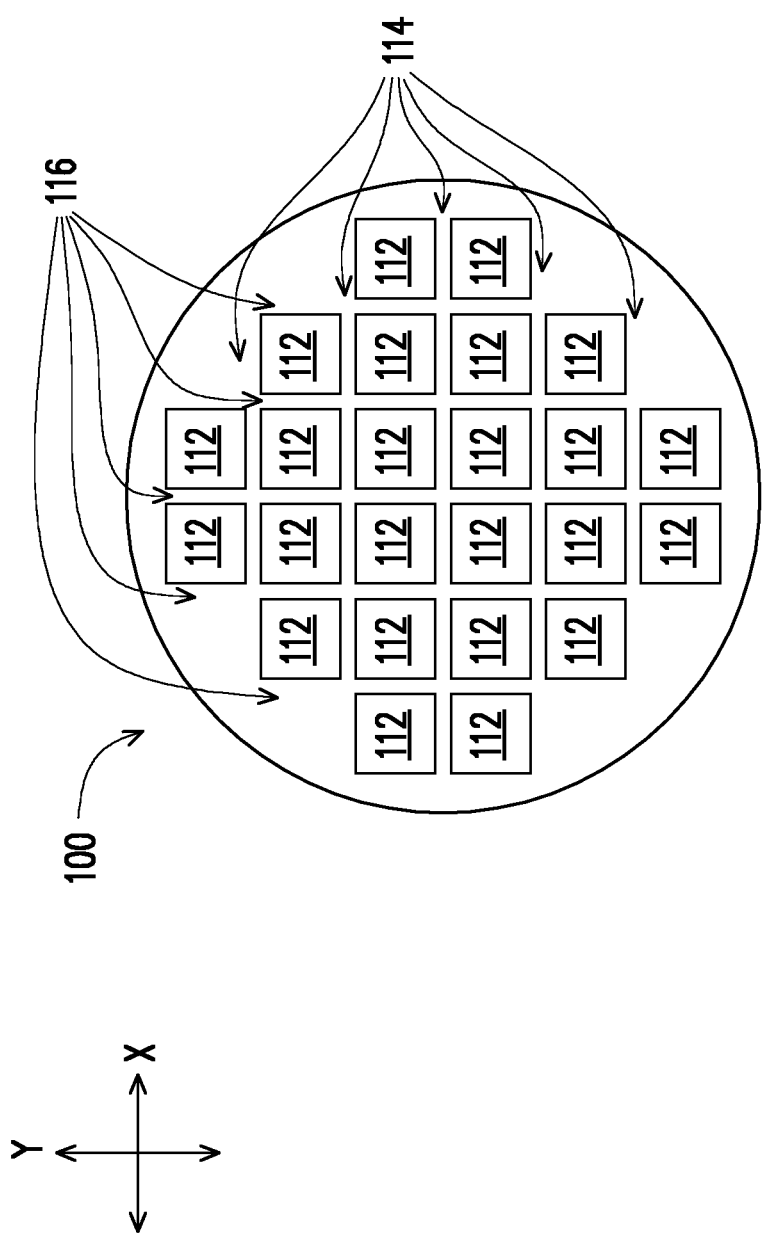
FIG. 1 illustrates a schematic top view of a wafer, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure advantageously provide an extended seal ring structure for a wafer level package. Seal ring structures are used around die areas to provide mechanical stress support and to provide a seal against humidity penetration. When one wafer is bonded to another wafer in wafer-on-wafer process and the dies are singulated from the wafers, chipping can occur at the die interface. The chipping can propagate along the interface and expose bond pads, allowing humidity penetration. The humidity can cause an increase in ohmic resistance across the bonding interface and result in die rejection and/or failure. To address this issue, embodiments of the present disclosure utilize an extended seal ring structure to bring the seal ring structure up through the bonding interface, creating a seal ring bond between the two wafers and spanning the bonding interface between the two wafers. The extended seal ring provides better mechanical stress support for the bonding interface and resists humidity penetration to the wafer level bonds. The extended seal ring structure may be formed by a metal-to-metal bonding process, a solder bump process, or a through-silicon-via process, as described below.

FIG. 1 illustrates a schematic top view of wafer 100 in accordance with some embodiments. Wafer 100 includes dies 112 and the adjoining dicing lanes or scribe lines 114 and dicing lanes or scribe lines 116, wherein scribe lines 114 and scribe lines 116 separate dies 112 from each other. Scribe lines 114 have longitudinal directions parallel to the X direction, and scribe lines 116 have longitudinal directions parallel to the Y direction, which is perpendicular to the X direction. In each of dies 112, there may be one or more seal rings wherein the outer boundaries of the seal rings define the outer boundaries of dies 112. Each of the scribe lines 114 is between and adjoining two rows of dies 112, and each of the scribe lines 116 is between and adjoining two columns of dies 112. It is noted that wafer 100 is intended to be an example only, and the sizes of dies 112, scribe lines 114 and scribe lines 116, etc. may vary based on the die designs.

Dies 112 may include a logic device, complementary metal oxide semiconductor (CMOS) device, micro-electro-mechanical systems (MEMS) device, integrated passive device (IPD), driver, or memory device such as memory cells including, and not limited to, Static Random Access Memory (SRAM) cells, Dynamic Random Access Memory (DRAM) Cells, Magneto-Resistive Random Access Memory (MRAM) cells, or the like. Dies 112 may include other types of devices.

FIGS. 2 through 12 illustrate intermediate views of a process of forming an extended seal ring structure for the dies 112.

FIG. 2 illustrates a cross-sectional view of die 112. The cross-section of FIG. 2 is a portion of a cross-section taken along the line A-A of FIG. 4 however the details may be varied from one view to another for the purposes of discussion. Die 112 includes a substrate 122, which may be a semiconductor substrate, such as a silicon substrate, a silicon germanium substrate, a silicon carbon substrate, an III-V compound semiconductor substrate, or the like. A device area 118 is formed at the surface or inside substrate 122. Device area 118 may comprise active or passive devices, such as transistors, resistors, capacitors, diodes, and the like. An example transistor device 108 is illustrated as being within the device area 118. In some embodiments, device area 118 may comprise an encapsulated die.

In some embodiments, an interconnect structure 126 may be used to redistribute connections between various active and passive devices. Interconnect structure 126 may include insulating layers 128, such as an inter-layer dielectric (ILD) and/or inter-metal dielectric layers (IMD) and conductive features (e.g., metal lines 127 and vias 129) formed in alternating layers over substrate 122 using any suitable method. Interconnect structure 126 may connect various active and/or passive devices in device area 118 of substrate 122 to form functional circuits. The insulating layers 128 may include low-k dielectric materials having k values, for example, lower than about 4.0 or even 2.8. The thickness of interconnect structure 126 may be between about 0.1 μm and about 6 μm, such as about 4 μm. Other thicknesses may be used.

More particularly, in some embodiments, the interconnect structure 126 may be formed by first depositing an insulating layer 128 over the substrate 122 and device area 118. In some embodiments, the insulating layer 128 is formed of a polymer, which may be a photo-sensitive material such as PBO, polyimide, BCB, or the like, that may be patterned using a lithography mask. In other embodiments, the insulating layer 128 is formed of a nitride such as silicon nitride; an oxide such as silicon oxide, undoped silicon glass (USG), PSG, BSG, BPSG; spin-on carbon; or the like. The insulating layer 128 may be formed by spin coating, lamination, CVD, the like, or a combination thereof.

The insulating layer 128 is then patterned. The patterning forms openings to expose portions of substrate 122 and device area 118 which include contacts (not shown) to the devices. The patterning may be by an acceptable process, such as by exposing the insulating layer 128 to light when the insulating layer 128 is a photo-sensitive material or by etching using, for example, an anisotropic etch. If the insulating layer 128 is a photo-sensitive material, the insulating layer 128 can be developed after the exposure.

To form a first layer of metal lines 127 and vias 129, a seed layer (not shown) is formed over the insulating layer 128 and in openings through the insulating layer 128. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pattern of the metal lines 127. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pattern of the metal lines 127 and vias 129. The vias 129 are formed in openings through insulating layer 128 to, e.g., the substrate 122 or device area 118.

An insulating layer 128 may then subsequently be deposited over the metal lines 127 and vias 129 and the process may be repeated as needed to form the interconnect structure 126 which forms a circuit and provides input/output to the substrate 122 and device area 118.

As each of the layers of the interconnect structure 126 is formed, seal ring structures 132 may also be formed. Two seal ring structures 132A and 132B are illustrated, but any number of seal ring structures 132 may be used. The seal ring structures 132 may be formed with via portions 134 and metal ring portions 136. The via portions 134 of the seal ring structures 132 may be formed at the same time and using the same processes and materials as the vias 129, discussed above. Similarly, the metal ring portions 136 may be formed at the same time and using the same processes and materials as the metal lines 127, discussed above.

In some embodiments, the via portions 134 may each include elongated trenches through the insulating layers 128, which are filled with a conductive material (e.g., the conductive material of the vias 129) to form vertical rings around the die 112. In other embodiments, the via portions 134 may be round or square protrusions through the insulating layers 128 to interconnect the different layers of the metal ring portions 136. The metal ring portions 136 form a solid horizontal ring around the periphery of the die 112.

In FIG. 3, a bond dielectric layer 138 is deposited over the interconnect structure 126. The bond dielectric layer 138 may be formed by the deposition of an insulating material. In some embodiments, the bond dielectric layer 138 is formed of a polymer, which may be a photo-sensitive material such as PBO, polyimide, BCB, or the like, that may be patterned using a lithography mask. In other embodiments, the bond dielectric layer 138 is formed of a nitride such as silicon nitride; an oxide such as silicon oxide, PSG, BSG, BPSG; or the like. The bond dielectric layer 138 may be formed by spin coating, lamination, CVD, the like, or a combination thereof. The bond dielectric layer 138 may be between about 0.01 μm and 2 μm thick, such as about 0.9 μm thick. Other thicknesses may be used.

The bond dielectric layer 138 is patterned to form openings 139 and openings 151 therein, exposing top metal lines 127 of the interconnect structure 126 and exposing a top metal layer of the metal ring portions 136 of the seal ring structures 132, respectively. The patterning may be by an acceptable process, such as by exposing the bond dielectric layer 138 to light when the bond dielectric layer 138 is a photo-sensitive material or by etching using, for example, an anisotropic etch. If the bond dielectric layer 138 is a photo-sensitive material, the bond dielectric layer 138 can be developed after the exposure.

Figure 4:
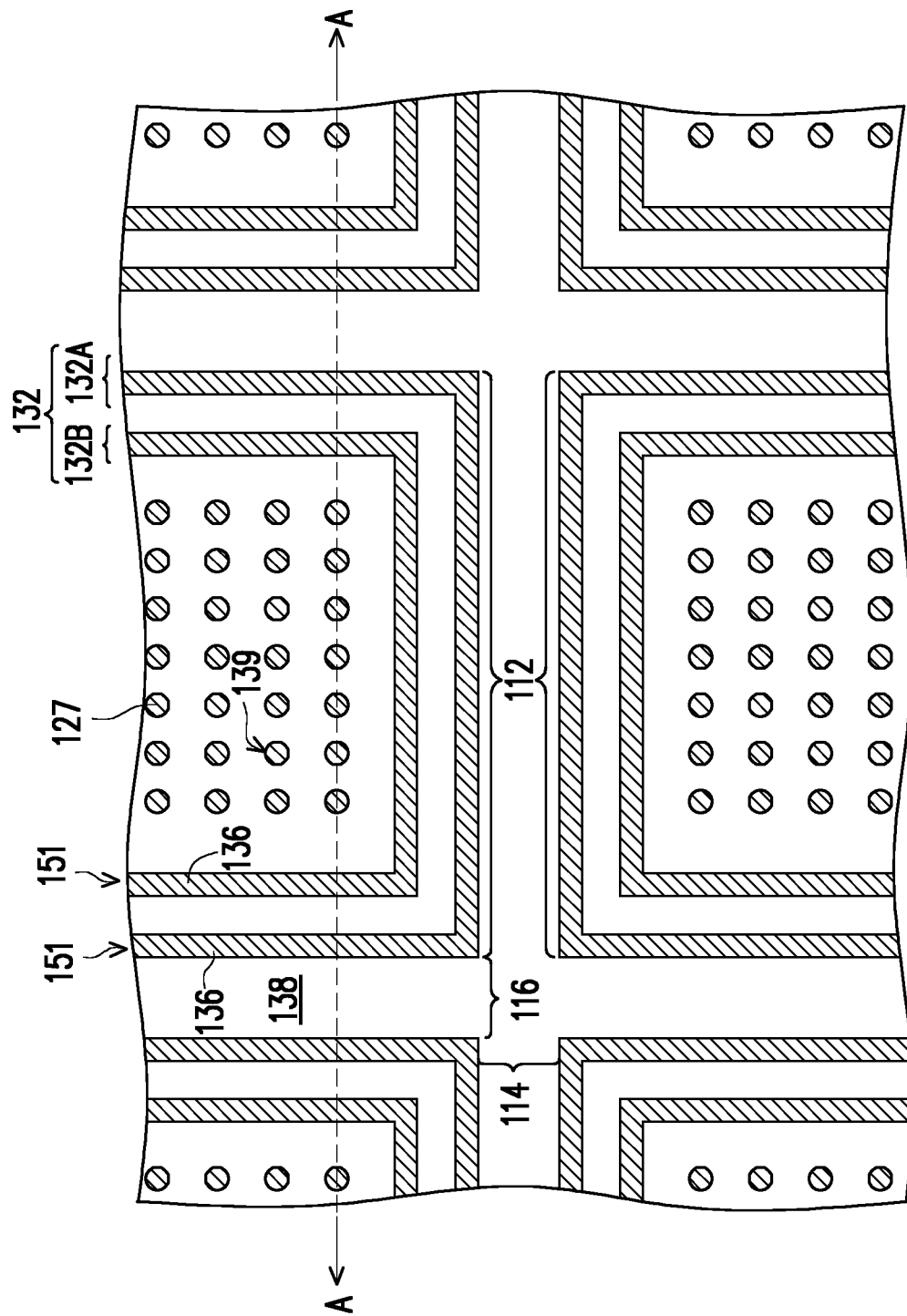

FIG. 4 illustrates a top view of a magnified portion of wafer 100 after the openings 139 and openings 151 are formed. As illustrated in FIG. 4, the top metal layer of the metal ring portions 136 of the seal ring structures 132 and the top metal layer of the metal lines 127 are revealed through the bond dielectric layer 138. The openings 139 are illustrated as being circles over the metal lines 127 and the openings 151 are illustrated as being ringed openings over the seal ring structures 132.

Figure 5:
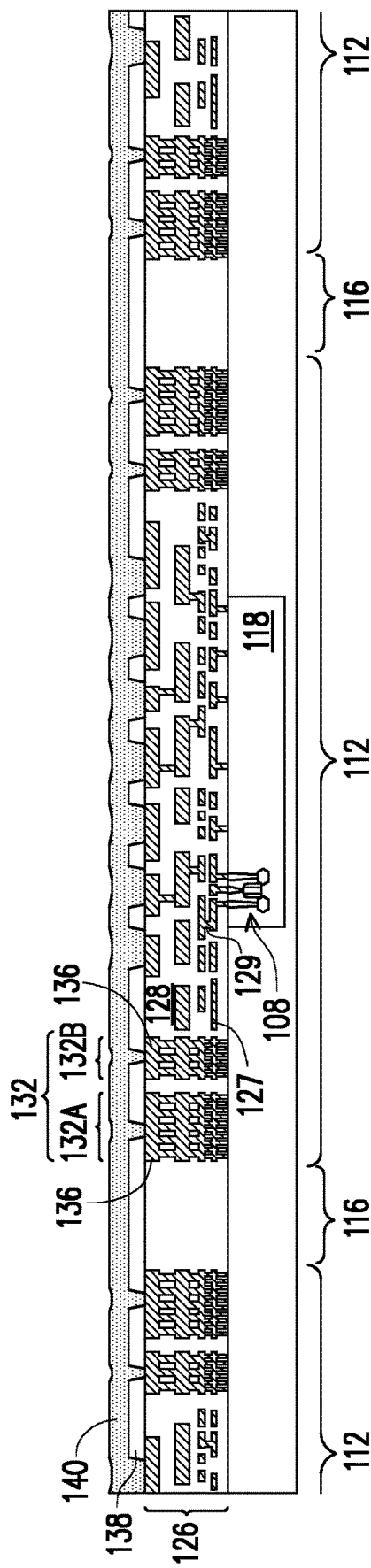

In FIG. 5, a conductive material 140 such as copper, titanium, titanium nitride, aluminum, the like, or a combination thereof, may be deposited in the openings 139 and openings 151 by a suitable deposition process, such as by a PVD, CVD, or a plating process, such as electroless plating, electroplating, or the like. The deposition process may fill both the openings 139 and openings 151 at the same time. An optional conductive seed layer may be first deposited in the openings 139 and openings 151 by a suitable process, such as by PVD. An optional barrier layer may also be deposited in the openings 139 and the openings 151 before the optional seed layer. The optional barrier layer may be deposited using any suitable process and serves to inhibit diffusion of the conductive material into the surrounding bond dielectric layer 138.

Figure 6:
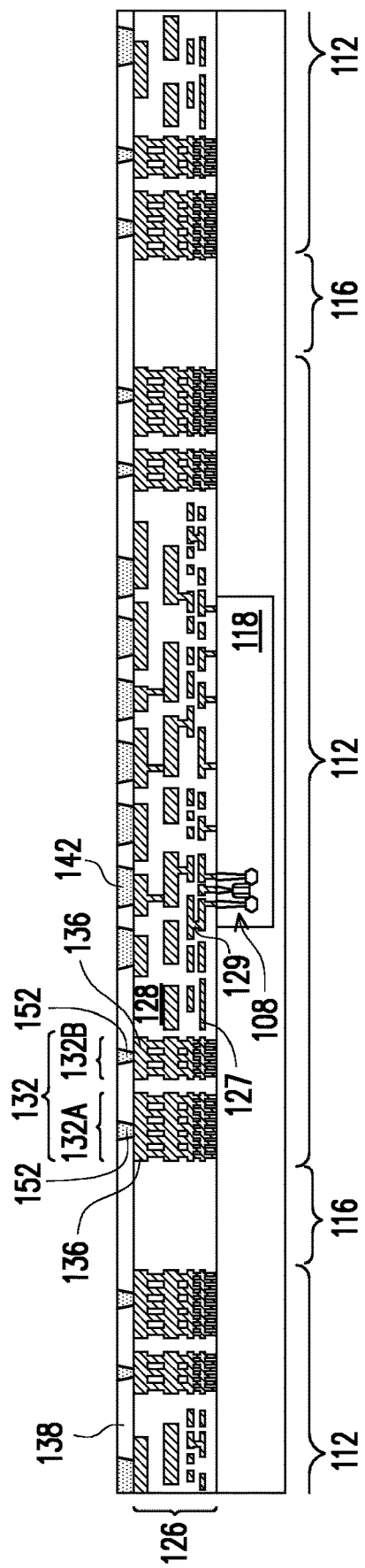

In FIG. 6, excess material of the conductive material 140 may be removed from over the bond dielectric layer 138 to form the bond pads 142 and the seal ring extensions 152. Any suitable process may be used to remove the excess material of the conductive material 140, such as a planarization process, such as a CMP process. Following the removal process, the upper surfaces of the bond pads 142 and the seal ring extensions 152 may be level with the upper surface of the bond dielectric layer 138.

Figure 7:
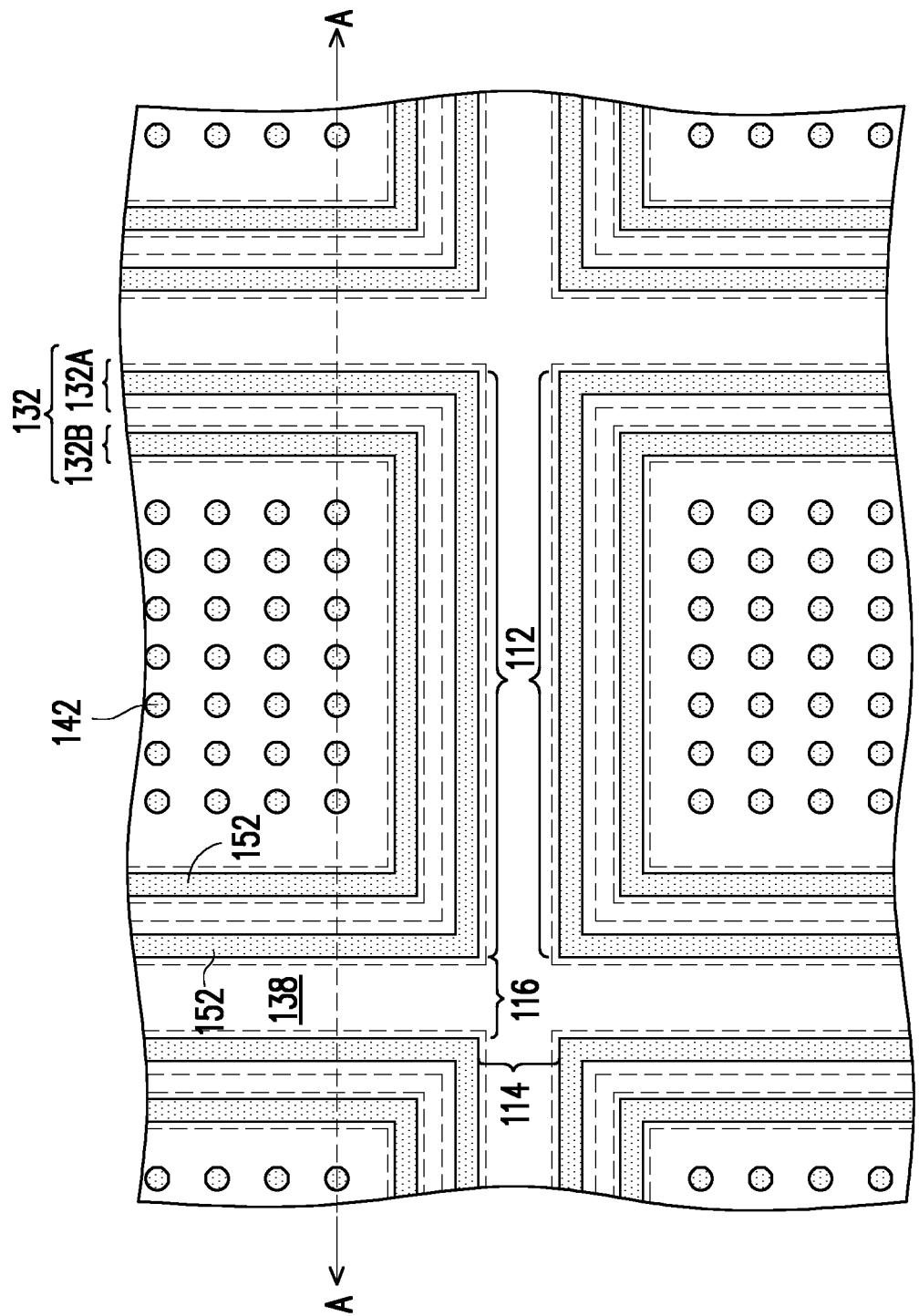

FIG. 7 illustrates a top view of a magnified portion of wafer 100 after the bond pads 142 and seal ring extensions 152 are formed. As illustrated in FIG. 7, the bond pads 142 are formed in a regular pattern, however, any distribution of the bond pads 142 may be utilized. The seal ring extensions 152 fill the openings 151 and are illustrated as being ringed structures over seal ring structures 132 (shown in phantom).

FIG. 8 through FIG. 15 illustrate the formation of optional bond pad vias 146. Utilizing bond pad vias 146 allows for the use of integrated testing pads, high density microcapacitors, and other structures disposed within the dielectric layer 144 of the bond pad vias 146. Bond pads 142 may be electrically connected to metal lines 127 and vias 129 by a corresponding bond pad via 146 for each active bond pad 142. The bond pad vias 146 and formation thereof described below may be incorporated into any of the other embodiments described below, but are omitted from views for the sake of simplicity.

In FIG. 8, a dielectric layer 144 may be formed over the interconnect structure 126. In some embodiments, the dielectric layer 144 is an oxide layer, which may comprise silicon oxide. In other embodiments, the dielectric layer 144 comprises other silicon and/or oxygen containing materials such as SiON, SiN, or the like, and may be formed by any suitable deposition technique. The dielectric layer 144 may be deposited to any suitable thickness, for example between 0.01 μm and about 1000 μm.

In FIG. 9, dielectric layer 144 is patterned to form openings 145 and openings 155 therein, exposing top metal lines 127 of the interconnect structure 126 and exposing a top metal layer of the metal ring portions 136 of the seal ring structures 132, respectively. The patterning may be by any acceptable process. In one embodiment, a photo mask is deposited over the dielectric layer 144, patterned using photolithographic techniques, and used as a mask to etch the openings 145 and openings 155 by using, for example, an anisotropic etch. The openings 155 may include individual separated vias exposing separated areas of the metal ring portions 136 in some embodiments, and in other embodiments, the openings 155 may include a trench that is formed to expose a continuous region of the metal ring portions 136 of the seal ring structures 132.

Figure 10:
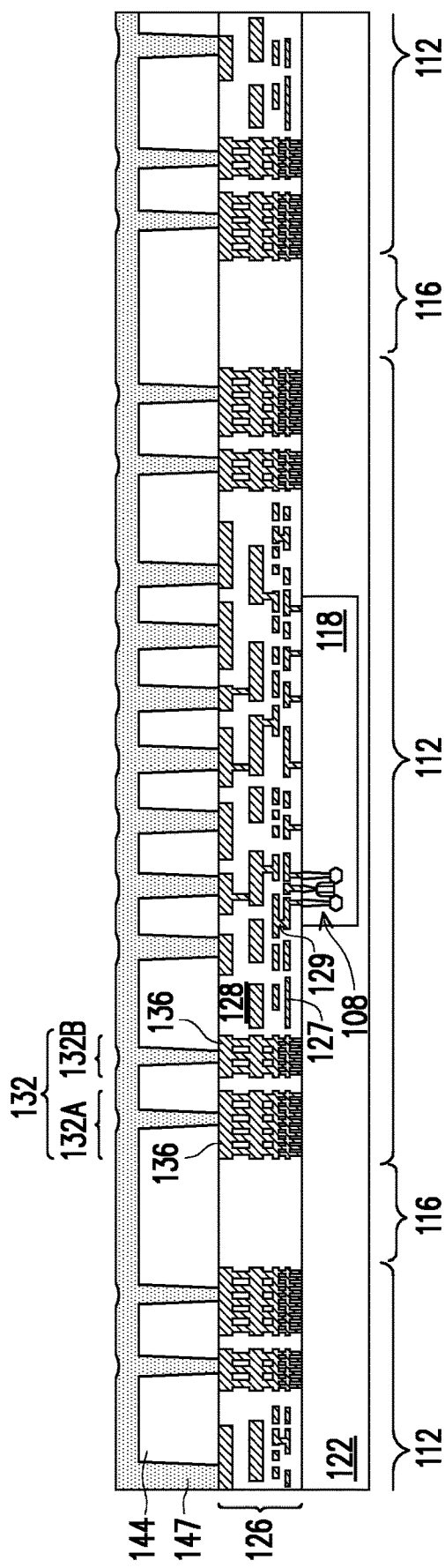

In FIG. 10, metal vias are formed by the deposition of a conductive material 147 such as copper, titanium, titanium nitride, aluminum, the like, or a combination thereof, in the openings 145 and the openings 155 by a suitable deposition process, such as by a PVD, CVD, or a plating process, such as electroless plating, electroplating, or the like on an optional seed layer first deposited in the openings. The deposition process may fill both the openings 145 and openings 155 at the same time. An optional conductive seed layer may be first deposited in the openings 145 and openings 155 by a suitable process, such as by PVD. An optional barrier layer may also be deposited in the openings 145 and the openings 155 before the optional seed layer.

Figure 11:
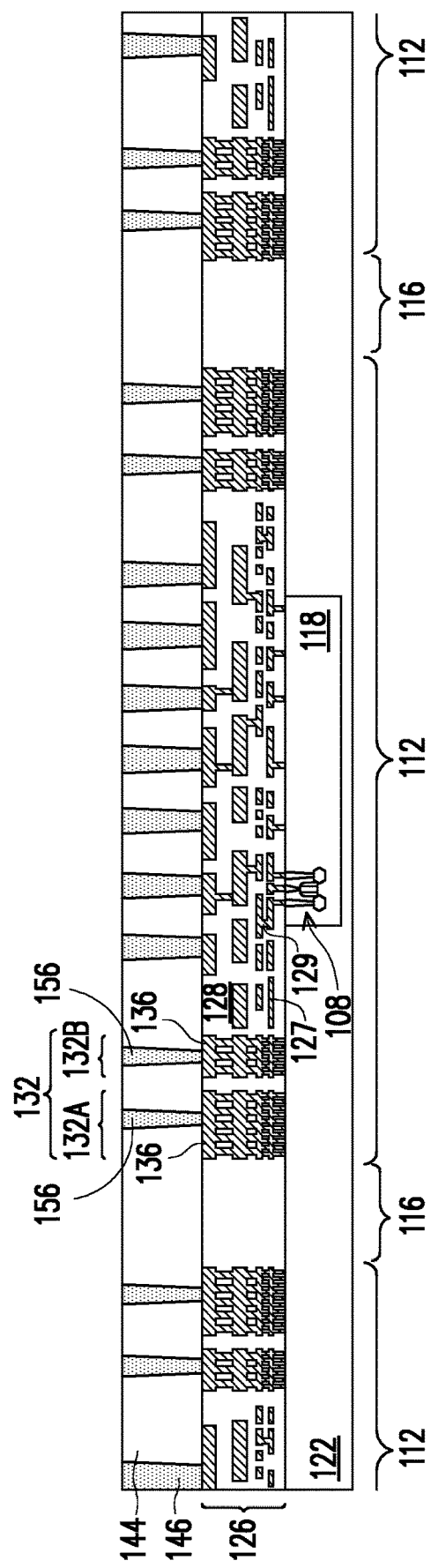

In FIG. 11, excess material of the conductive material 147 may be removed from over the dielectric layer 144 to form the bond pad vias 146 and the seal ring extension vias 156. Any suitable process may be used to remove the excess material of the conductive material 147, such as a planarization process, such as a CMP process. Following the removal process, the upper surfaces of the bond pad vias 146 and the seal ring extension vias 156 may be level with the upper surface of the dielectric layer 144.

Figure 12:
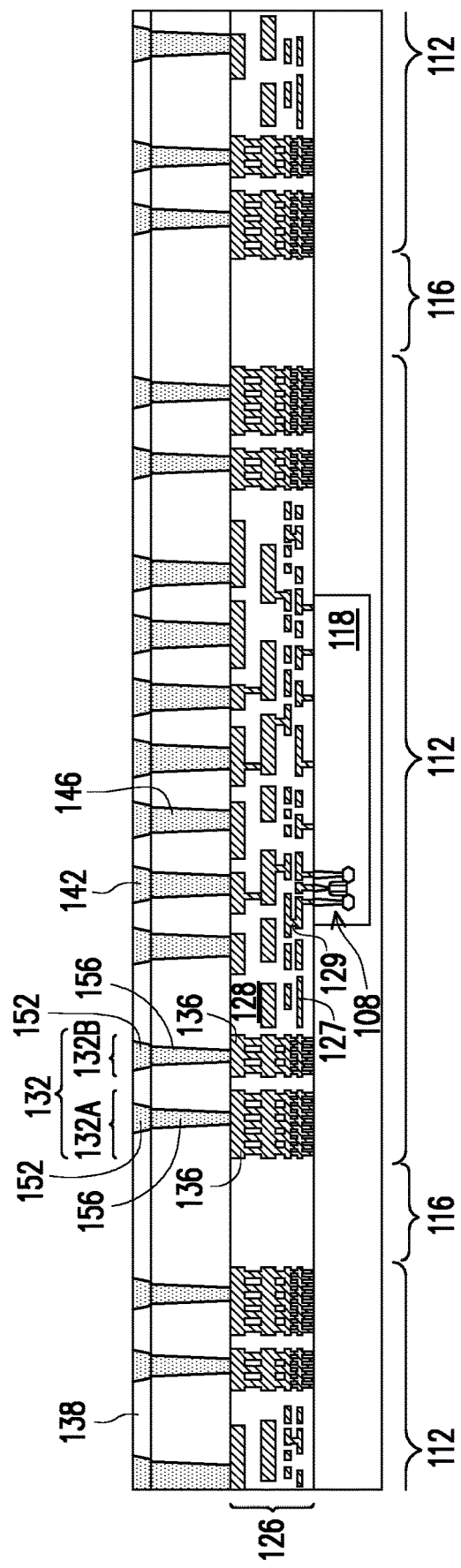

FIG. 12 illustrates bond pads 142 and seal ring extensions 152 disposed over the bond pad vias 146 and the seal ring extension vias 156, respectively. The bond pads 142 and seal ring extensions 152 may be formed using processes and materials described above with respect to FIGS. 3 through 6, with like references referring to like elements. As noted above, the inclusion of bond pad vias 146 and the seal ring extension vias 156 may be added to the other embodiments below, but are not illustrated for the sake of simplicity.

Figure 13:
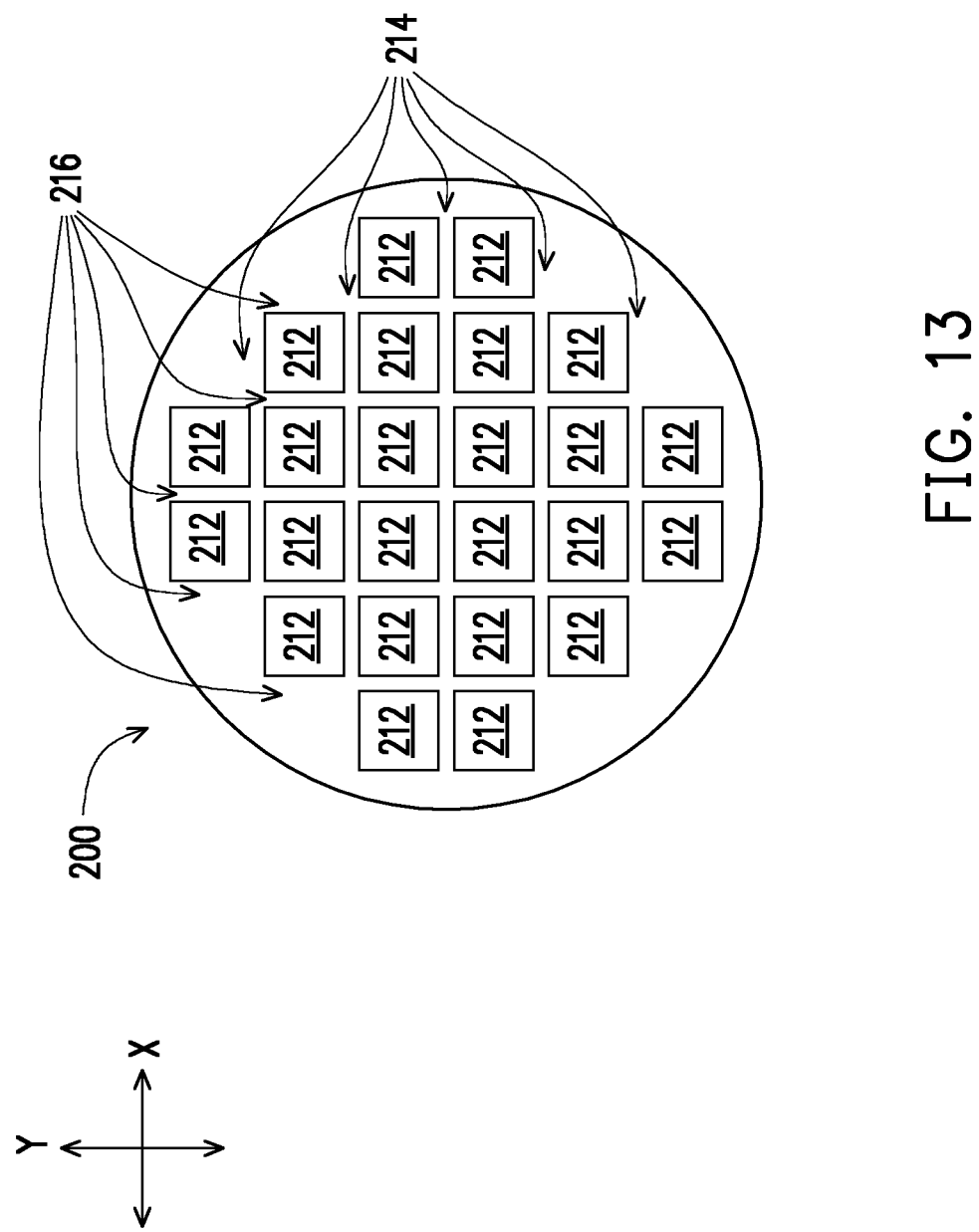
FIG. 13 illustrates a schematic top view of a wafer, in accordance with some embodiments.
Figure 14:
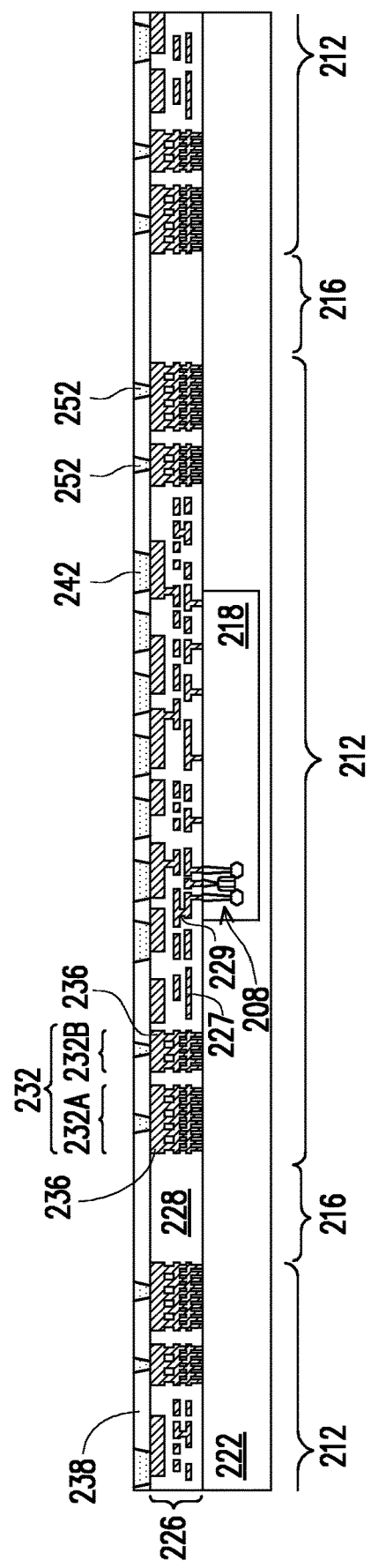
FIG. 14 illustrates a cross sectional view of a wafer, in accordance with some embodiments.

FIGS. 13 through 14 illustrate die 212 in accordance with some embodiments. Like features of die 212 are labelled with like identifiers used above with respect to die 112, except modified to lead with the number 2. Although the die 212 is not illustrated as having bond pad vias, such as the bond pad vias 146 of FIG. 12, it should be understood that bond pad vias may be present in some embodiments. FIG. 13 illustrates a schematic top view of wafer 200 in accordance with some embodiments. Wafer 200 includes dies 212 and the adjoining dicing lanes or scribe lines 214 and 216, wherein scribe lines 214 and 216 separate dies 212 from each other. Scribe lines 214 have longitudinal directions parallel to the X direction, and scribe lines 216 have longitudinal directions parallel to the Y direction, which is perpendicular to the X direction. In each of dies 212, there may be one or more seal rings wherein the outer boundaries of the seal rings define the outer boundaries of dies 212. Each of the scribe lines 214 is between and adjoining two rows of dies 212, and each of the scribe lines 216 is between and adjoining two columns of dies 212. It is noted that wafer 200 is intended to be an example only, and the sizes of dies 212, scribe lines 214 and 216, etc. may vary based on the die designs.

Dies 212 may be a similar or identical device as dies 112, in some embodiments and may have similar dimensions thereto, including thicknesses of layers and so forth. In some embodiments, dies 212 can be different than dies 112, and may include a logic device or memory device such as memory cells including, and not limited to, Static Random Access Memory (SRAM) cells, Dynamic Random Access Memory (DRAM) Cells, Magneto-Resistive Random Access Memory (MRAM) cells, or the like. Dies 212 may include other types of devices.

FIG. 14 illustrates a cross-sectional view of die 212. As noted above, like features of die 212 as compared to die 112 are labeled with like references. The processes and materials used to form the die 212 may be the same as that used with respect to die 112.

Figure 15:
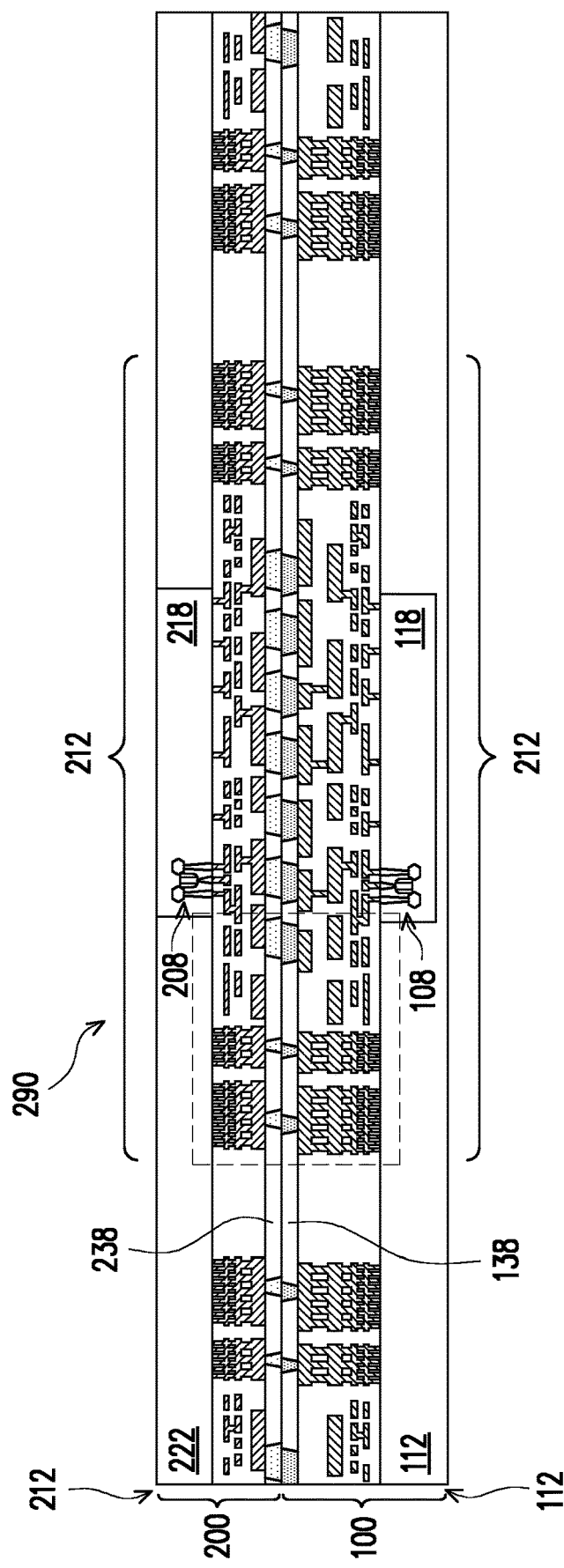

FIG. 15 illustrates a process of bonding the wafer 200 to the wafer 100 to bond the die 212 to the die 112 to form wafer stack 290. Optional bond pad vias 146 and bond pad vias for die 212 are omitted from the view for simplicity. Although a wafer-to-wafer bonding is illustrated, it should be understood that the bonding can be wafer-to-wafer where both wafers are directly bonded together, chip-to-chip where two singulated chips (or dies) are directly bonded together, or chip-to-wafer where one or more chips (or dies) are directly bonded together, wherein the bond dielectric layer 138 of one die is fusion bonded to the bond dielectric layer 238 of another die, the bond pads 142 of the die 112 are bonded to the bond pads 242 of the die 212, and the seal ring extensions 152 of the die 112 are bonded to the seal ring extensions 252 of the die 212 without using any eutectic material, such as solder. For example, in a wafer-to-wafer bonding, wafer 100 is bonded to wafer 200 through hybrid bonding, wherein dies 112 are bonded to dies 212 prior to singulation. In the hybrid bonding of wafers 100 and 200, bond dielectric layer 138 is bonded to bond dielectric layer 238 through fusion bonding, the metal of bond pads 142 are bonded to the metal of bond pads 242 through metal-to-metal bonding, and the metal of seal ring extensions 152 are bonded to the metal of the seal ring extensions 252 through metal-to-metal bonding. Chip-to-chip or chip-to-wafer bonding proceeds similarly, except for the method used for aligning the chips or chips and wafer.

The bonding process may include a pre-bonding and an annealing. During the pre-bonding, a small pressing force may be applied to press wafers 100 and 200 against each other. The pre-bonding may be performed at room temperature (for example, between about 21° C. to about 25° C.), although higher temperatures may be used. After the pre-bonding, bond dielectric layers 138 and 238 are bonded to each other. The bonding strength is improved in a subsequent annealing step, in which the bonded wafers 100 and 200 are annealed at a temperature between about 300° C. and about 400° C., for example.

The annealing may be performed for a period of time between about 1 hour and 2 hours. In an example embodiments, when the temperature rises, the OH bond in bond dielectric layer 138 and bond dielectric layer 238 break to form strong Si—O—Si bonds, and hence wafers 100 and 200 are bonded to each other through fusion bonds (and through Van Der Waals force). In addition, during the annealing, the metal (such as copper) in bond pads 142 and bond pads 242 and the metal in seal ring extensions 152 and seal ring extensions 252 diffuse into each other, so that metal-to-metal bonds are also formed. Hence, the resulting bonds between wafers 100 and 200 are hybrid bonds.

FIGS. 16a and 16b are enlarged views of a portion of FIG. 15, as indicated by the dashed box in FIG. 15. In FIG. 16a, bond pads 142 and 242 are illustrated as being bonded together with a one-to-one correspondence. Similarly, the seal ring extensions 152 and seal ring extensions 252 are likewise bonded together to form a continuous seal ring through the bonding interfaces of each of the wafers 100 and 200.

As illustrated in FIG. 16a, the bonding need not occur with perfect alignment and embodiments advantageously allow for a lateral offset d1 between the bond pads 142 and 242 and/or the seal ring extensions 152 and 252. The lateral offset d1 may be no larger than the minimum bond pad spacing so as not to interfere with neighboring bond pads and also no larger than half of the minimum bond pad size to ensure good connectivity between the bond pads. For example, if the bond pad spacing is 2 μm and the bond pad size is 1 μm, then the lateral offset d1 may be between 0 and 0.5 μm. If the bond pad spacing is 1 μm and the bond pad size is 2 μm, then the lateral offset d1 may be between 0 and 1 μm. The lateral offset d1 also allows for other process variations so that alignment need not be perfect.

FIG. 16b is similar to the embodiment illustrated in FIG. 16a, except the seal ring extensions 252 extend from the same seal ring structure 232, while the seal ring extensions 152 extend from different seal ring structures 132A and 132B. This illustrates that embodiments may flexibly extend the seal ring structures (e.g., seal ring structures 132 and 232) using different configurations. For example, in some embodiments some seal ring structures may be extended, while other seal ring structures are not extended.

The embodiments discussed above apply when the die sizes are the same such that the edges of the two dies 112 and 212 of wafers 100 and 200, respectively, are aligned. Similar processes can be used to provide bonding with dies of two different sizes, for example, aligning at least one seal ring structure 232 of the die 212 with a seal ring structure 132 of the die 112.

Figure 17:
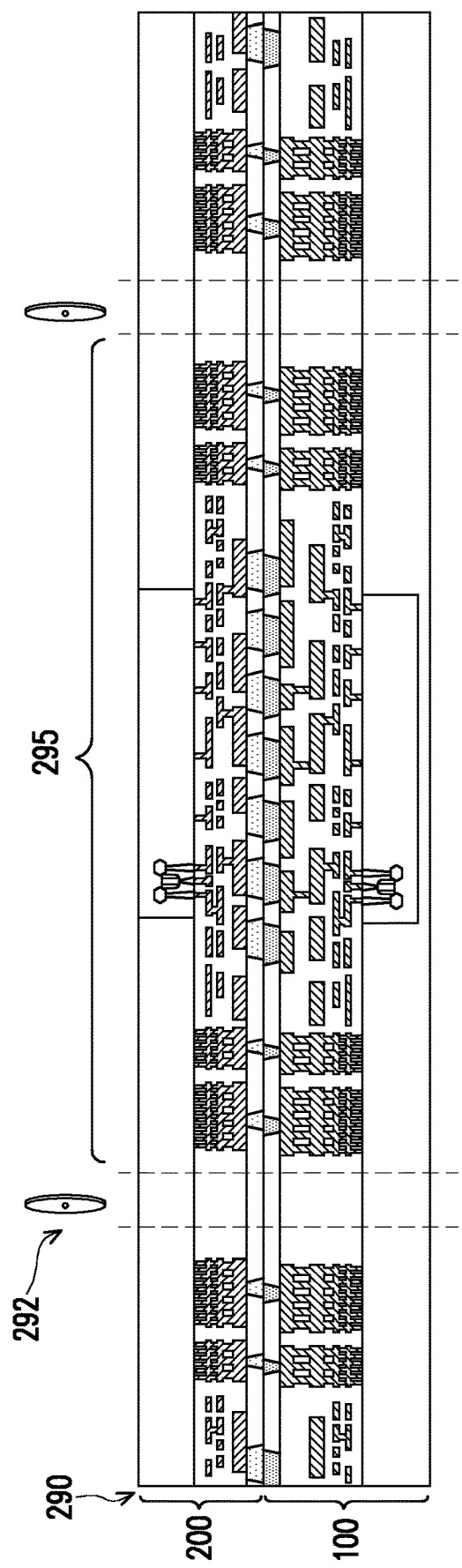

In FIG. 17, the wafer stack 290 is singulated into packages 295. The packages 295 may be singulated using any suitable cutting technique 292. Cutting technique 292 can include a dry etch, wet etch, anisotropic etch, or plasma etch using suitable etchants. Cutting technique 292 can include a laser making multiple passes to laser dice the packages 295 from one another. Cutting technique 292 can include a mechanical process, such as a saw set to cut to a desired depth. A combination of the above described cutting techniques 292 may also be used. Singulation occurs through the non-package regions (outside package areas, see, e.g., scribe lines 114 and 116 of FIG. 1 and scribe lines 214 and 216 of FIG. 13). The singulation cuts through the processed wafer stack 290, resulting in packages 295. Due to the seal ring extensions 152 and 252, chipping resulting from the singulation is reduced or eliminated that would propagate to the bonding interface or to the bond pads 142 and 242.

Figure 18:
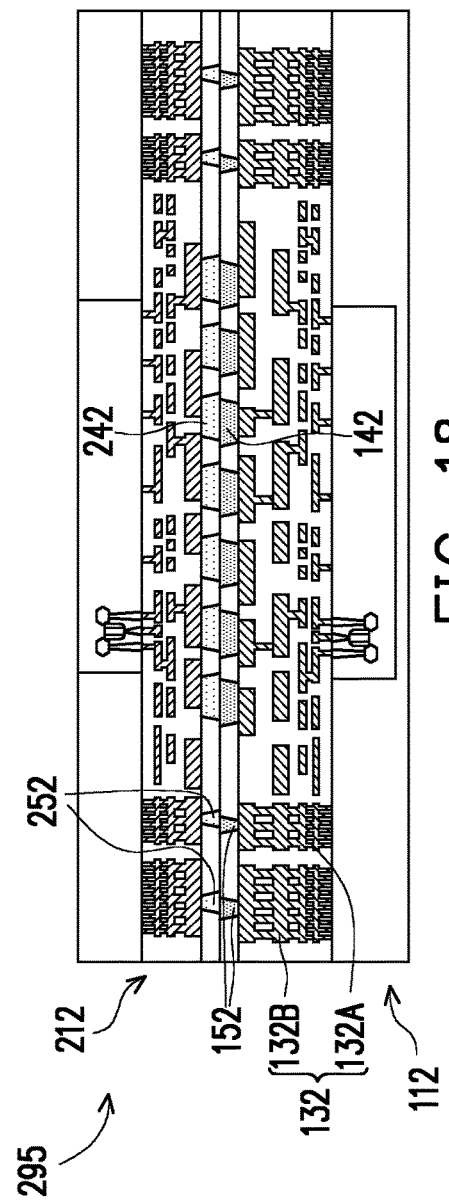

FIG. 18 illustrates the singulated package 295 with seal ring extensions 152 and 252. The seal ring extensions 152 and 252 serve to reduce chipping propagation and keep out humidity and contaminants from penetrating along the bonding interface to affect the bonding of the bond pads 142 and 242.

Figure 19:
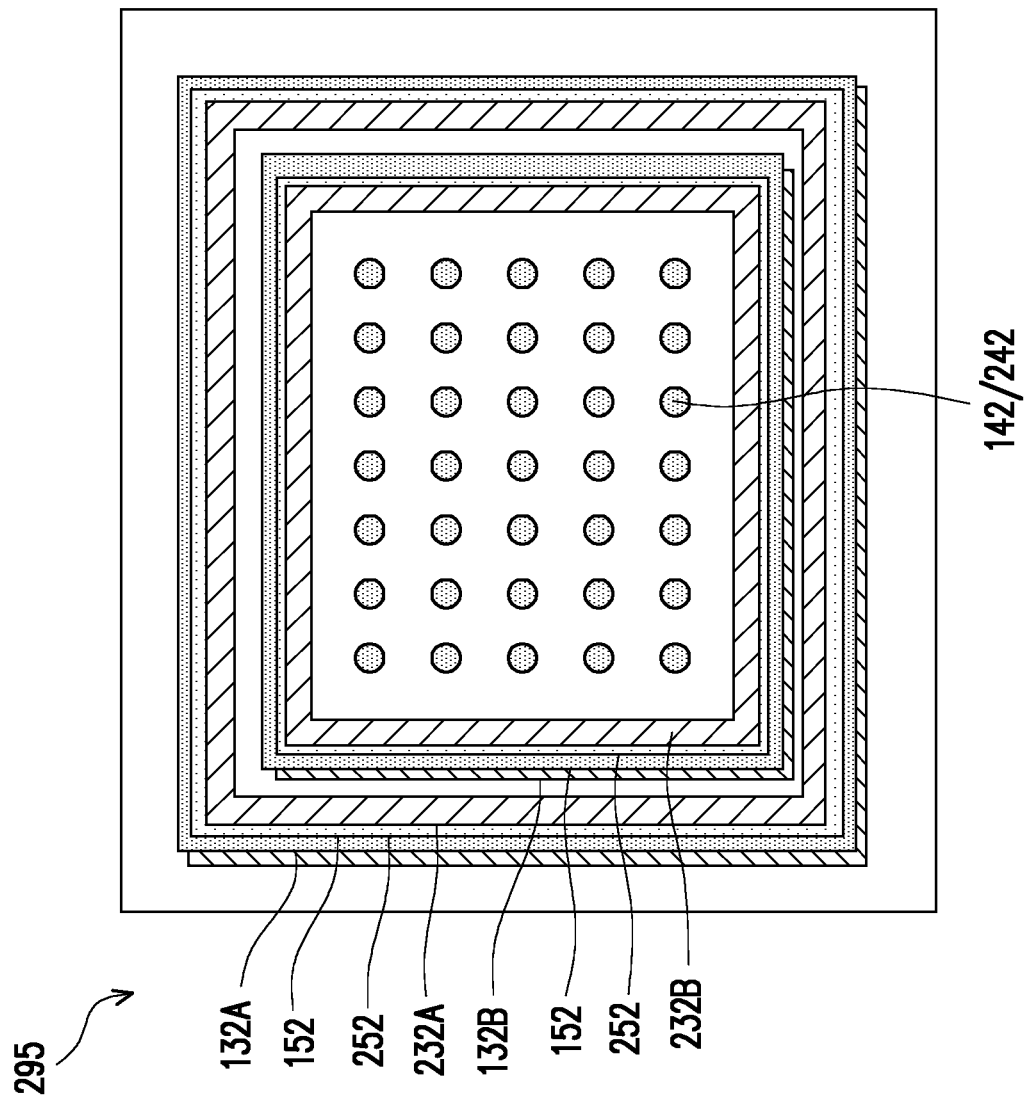

FIG. 19 illustrates a plan view of the package 295. The various illustrated elements may not actually be visible in the final package, but are illustrated in this view for context. The seal ring extensions 152 surround the bond pads 142 (and bond pad vias 146, if used). The seal ring extensions 152 run with the seal ring structures 132A and 132B around the periphery of the die 112. Similarly, the seal ring extensions 252 surround the bond pads 242 (and corresponding bond pad vias, if used). The seal ring extensions 252 run with the seal ring structures 232A and 232B around the periphery of the die 212. The shape illustrated is rectangular, but may include any suitable shape, and may have rounded off corners or dog-eared corners, or the like.

FIGS. 20 through 25 illustrate various views associated with an eutectic seal ring extension, in accordance with some embodiments. Wafer 300 of FIG. 20 may be formed using processes and materials similar to those discussed above with respect to FIG. 3, with like references referring to like elements, except that the leading 1 is replaced with a 3. Although not illustrated for simplicity, the bond pad vias 146 illustrated above with respect to FIG. 12 may also be formed in this embodiment using processes and materials similar to those discussed above.

Figure 20:
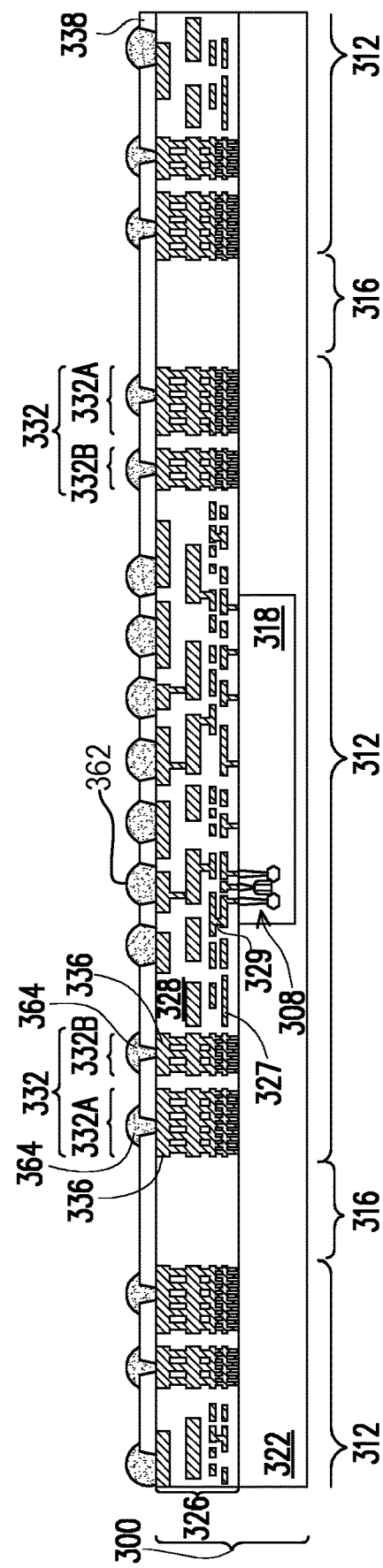
FIG. 20 illustrates a cross sectional view of a wafer, in accordance with some embodiments.

Following forming the openings 139 and the openings 151 (see FIG. 3), a bump material, such as a solder or eutectic material, may be formed in the openings 139 and 151 to form bumps 362 over the interconnect 326 and seal ring extensions 364 over the seal ring structures 336, as illustrated in FIG. 20. In some embodiments, an under bump metallization layer or seed layer may be formed in the openings 139 and 151 prior to forming the bumps 362 and the seal ring extensions 364. The under bump metallization layer or seed layer may be formed by forming a photomask layer over the insulating layer 338, and forming openings in the photomask layer corresponding to the openings 139 and 151, then using a suitable deposition process, such as ALD, PVD, or CVD, to form the under bump metallization layer or seed layer in the openings 139 and 151 and over the photomask layer. Then the photomask layer may be removed, thereby removing the unwanted portions of the under bump metallization layer or seed layer.

Next, the bumps 362 and seal ring extensions 364 may be formed at the same time, using any suitable process. For example, the bumps 362 and seal ring extensions 364 may be formed by a solder printing technique, a plating technique, a plate transfer technique, and so forth. The material used for the bumps 362 and seal ring extensions 364 may include any suitable eutectic material such as a solder, a high lead bump, a lead-free bump, a tin-lead eutectic bump, an aluminum-germanium eutectic bump, the like, or combinations thereof. After deposition, the bumps 362 and seal ring extensions 364 may be reflowed to bond with the seed layer, the under bump metallization layer, or the metal lines 327 of the interconnect 326.

Figure 21:
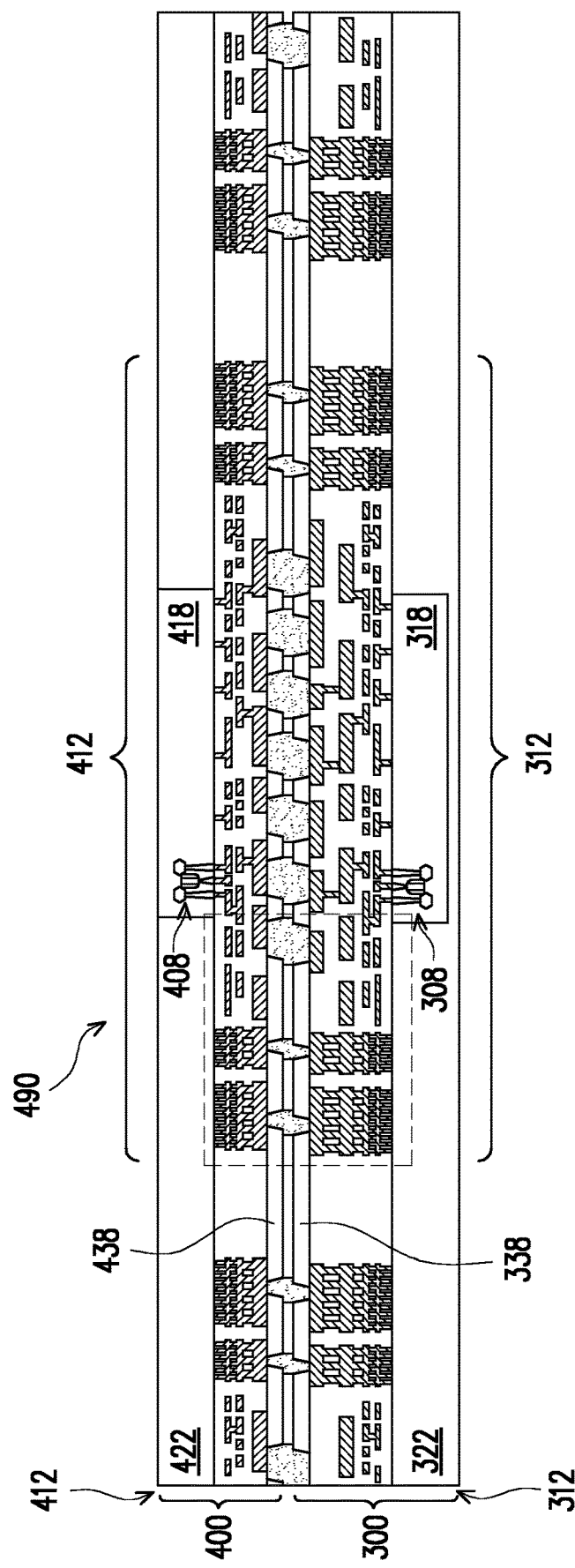
FIGS. 21 through 25 illustrate various views of intermediate steps of forming a seal ring extension through a wafer stack and device package, in accordance with some embodiments.
Figure 22:
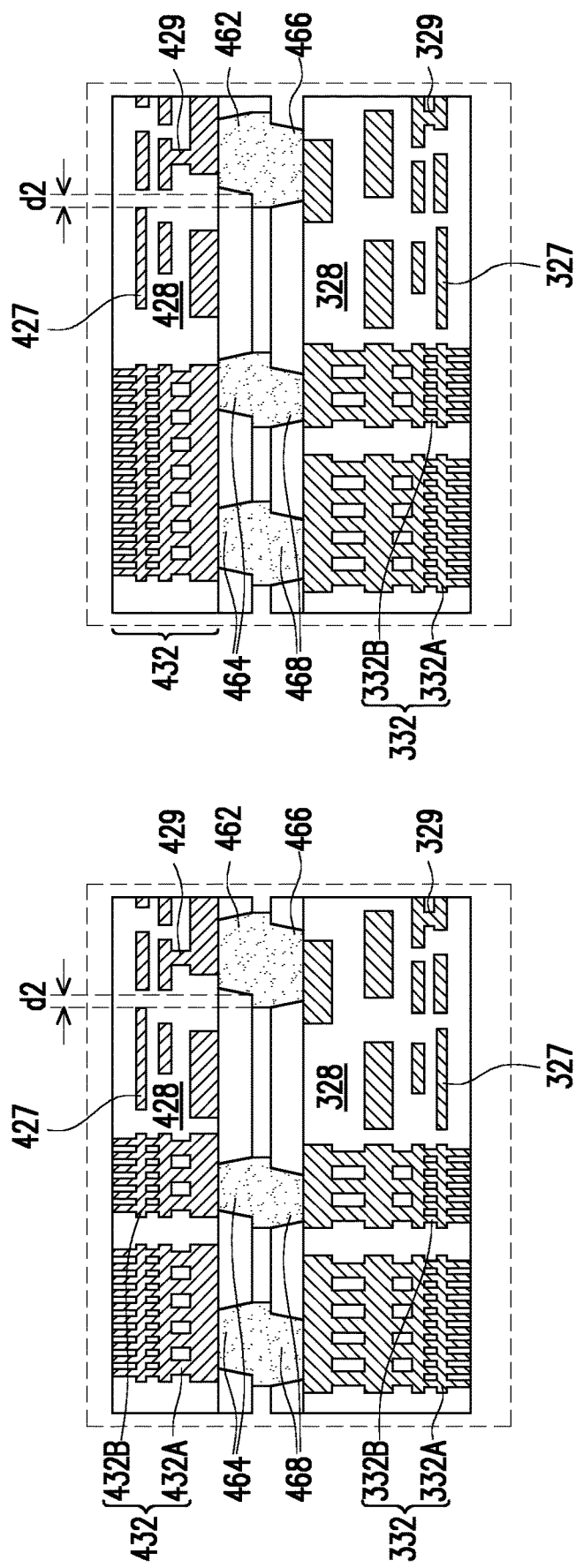

In FIG. 21, the wafer 400 may be bonded to the wafer 300 to form a wafer on wafer stack 490. The wafer 400 may be prepared in a manner similar to the wafer 300, in accordance with some embodiments, with like references referring to like elements, except that the leading 3 is replaced with a 4. In other embodiments, the wafer 200 may be used. The wafer 400 may be placed on the wafer 300 and the eutectic material of the bumps 362 (and corresponding bumps 462) reflowed to form a continuous connection of merged bumps 466 (see FIG. 22a), and the eutectic material of the seal ring extensions 364 (and corresponding seal ring extensions 464) reflowed to form a continuous seal ring extension 468 (see FIG. 22a).

FIGS. 22a and 22b are enlarged views of a portion of FIG. 21, as indicated by the dashed box in FIG. 21. In FIG. 22a, bumps 362 and 462 are illustrated as being bonded together with a one-to-one correspondence to form merged bumps 466. Similarly, the seal ring extensions 364 and seal ring extensions 464 are likewise bonded together to form a continuous seal ring extension 468 through the bonding interfaces of each of the wafers 300 and 400.

FIGS. 21, 22a, and 22b also illustrate that, in some embodiments, a gap between the wafer 300 and the wafer 400 may remain between the two wafers following the bonding. The gap or void is sealed by the seal ring extension 468 to keep contaminants and moisture out of the gap, so that no underfill is necessary. The wafers 300 and 400 may be laterally offset by the distance d2, allowing for slight misalignment or other process variance. The lateral offset d2 may be no larger than the minimum bond pad spacing so as not to interfere with neighboring bond pads and also no larger than half of the minimum bond pad size to ensure good connectivity between the bond pads. For example, if the bond pad spacing is 2 μm and the bond pad size is 1 μm, then the lateral offset d2 may be between 0 and 0.5 μm. If the bond pad spacing is 1 μm and the bond pad size is 2 μm, then the lateral offset d1 may be between 0 and 1 μm.

FIG. 22b illustrates an expanded view of the dashed portion of FIG. 21, in accordance with some embodiments. In FIG. 22b, the seal ring structures 332A and 332B are bonded to a single seal ring structure 432 of the wafer 400. Embodiments advantageously provide the ability to flexibly bond seal ring structures in one wafer to another wafer by the seal ring extensions. Different combinations of configurations may be used to extend the different seal ring structures to each other. Also, in some embodiments, some seal ring structures may not be extended by a seal ring extension.

Figure 23:
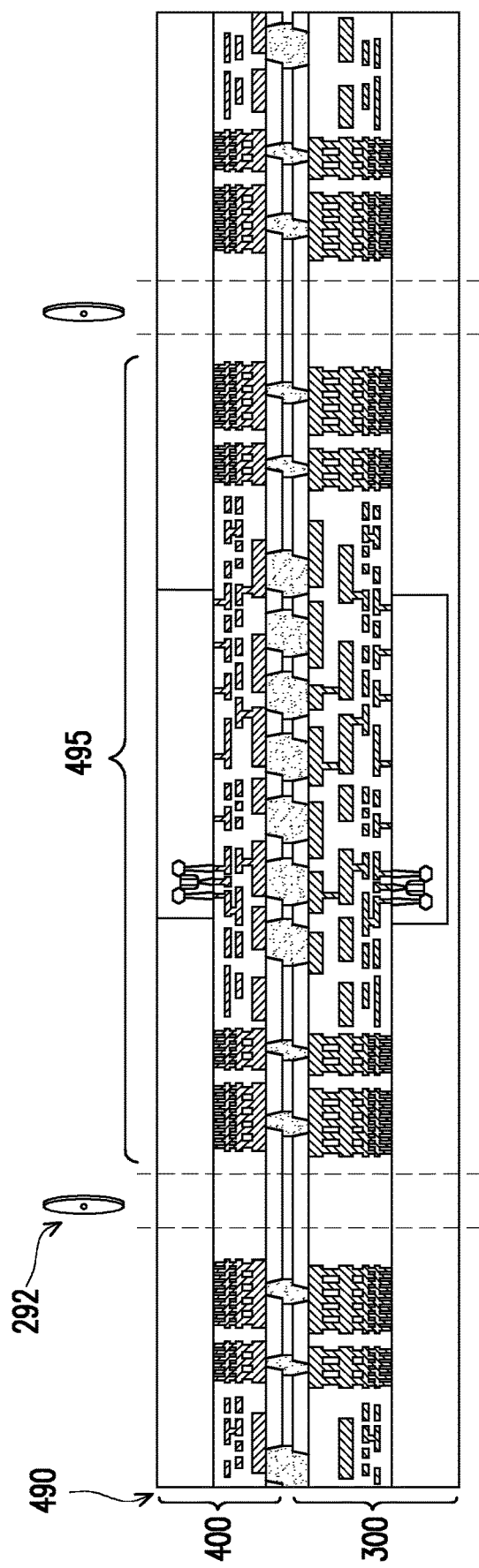

In FIG. 23, the wafer stack 490 is singulated into packages 495. The packages 495 may be singulated using any suitable cutting technique 292, described above.

Figure 24:
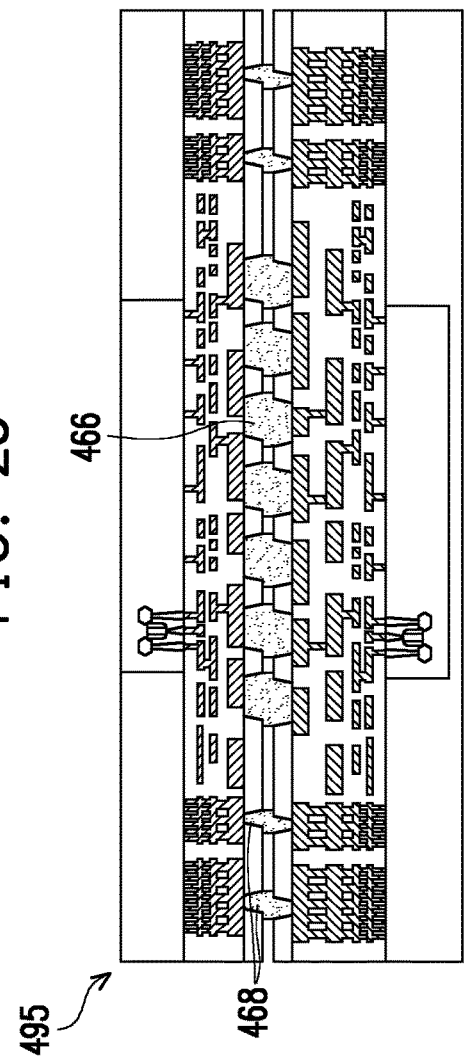

FIG. 24 illustrates the singulated package 495 with seal ring extension 468. The seal ring extension 468 serves to reduce chipping propagation and keep out humidity and contaminants from penetrating along the bonding interface and/or between the two wafers to affect the bonding of the bumps 362 and 462. In some embodiments, an underfill material may be used between the wafer 300 and the wafer 400 after singulation to fill in the gap up to the first seal ring extension 468.

Figure 25:
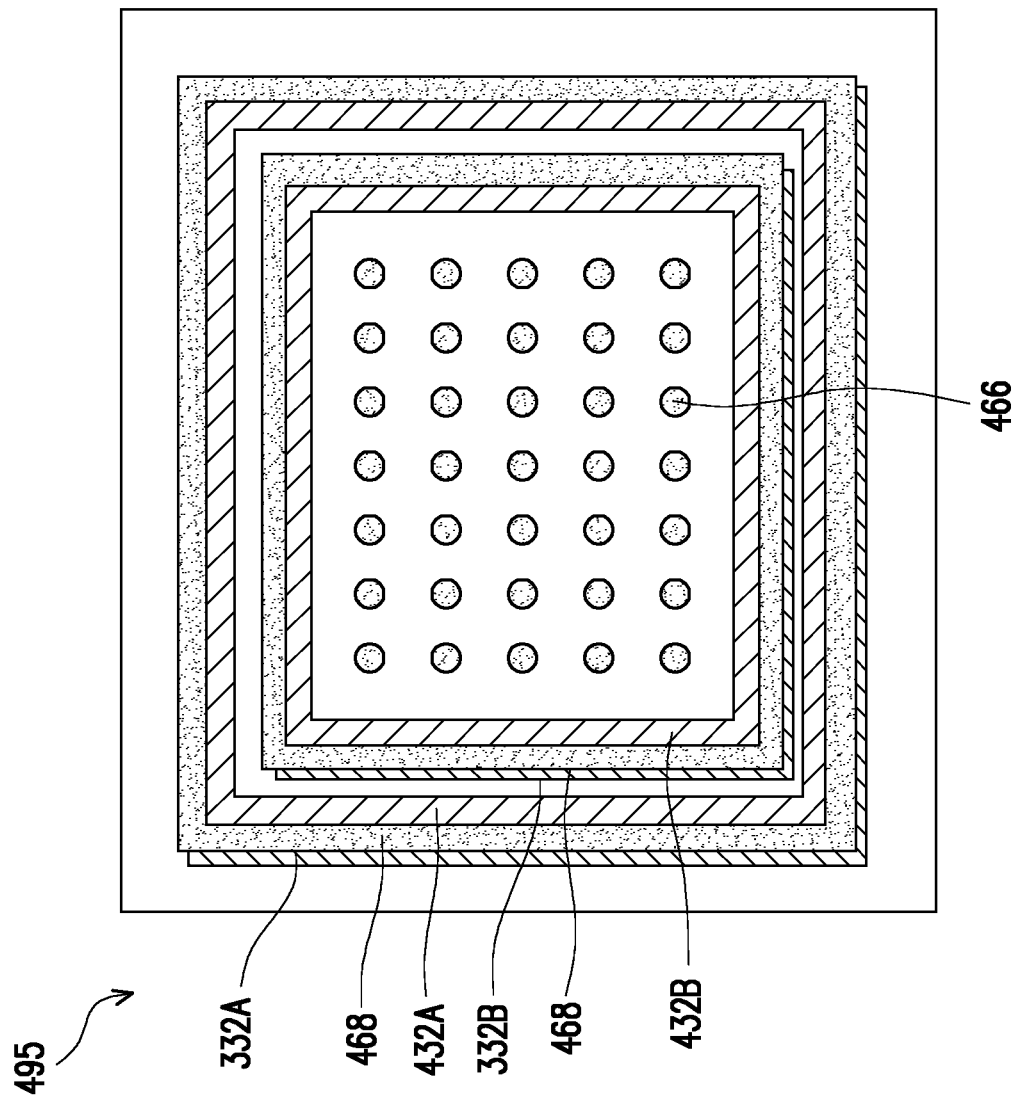

FIG. 25 illustrates a plan view of the package 495. The various illustrated elements may not actually be visible in the final package, but are illustrated in this view for context. The merged seal ring extension 468 surround the merged bumps 466 (and bond pad vias of each wafer, if used). The seal ring extension 468 runs with the seal ring structures 332A and 332B around the periphery of the die 312. Similarly, the seal ring extension 468 runs with the seal ring structures 432A and 432B around the periphery of the die 412. The shape illustrated is rectangular, but may include any suitable shape, and may have rounded off corners or dog-eared corners, or the like.

Figure 26:
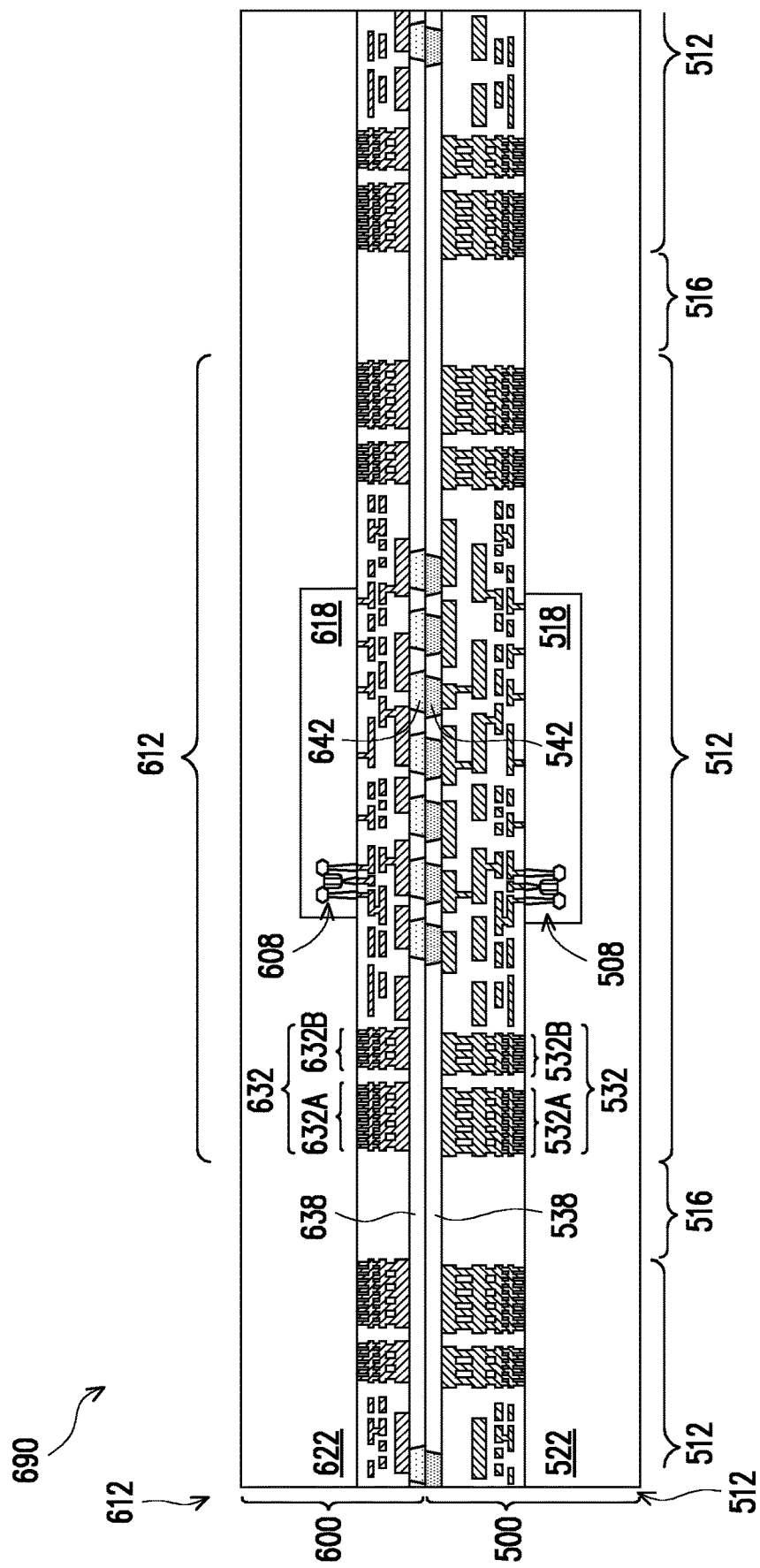
FIGS. 26 through 34 illustrate various views of intermediate steps of forming a seal ring extension through a wafer stack and device package, in accordance with some embodiments.

FIGS. 26 through 33 illustrate intermediate views of a process of forming an extended seal ring structure 660 extending through a wafer stack, in accordance with some embodiments. FIG. 26 illustrates a wafer stack 690 including wafer 500 bonded to wafer 600. In some embodiments, wafers 500 and 600 are each similar to the wafer 100 with like references referring to like elements, except that the leading 1 is replaced by a 5 and 6, respectively. The seal ring structures 532 and 632, however, do not include seal ring extensions. In such embodiments, wafers 500 and 600 are bonded together using hybrid bonding, such as described above with respect to FIG. 15 and the dielectric layer 538 is fusion bonded to the dielectric layer 638 and the bond pads 542 are directly bonded to the bond pads 642 with a metal-to-metal bond. In other embodiments, wafers 500 and 600 are each similar to the wafer 300 and the wafer stack 690 is bonded together using bumps (see FIG. 32, discussed below) which are reflowed to perform the bonding. In such embodiments, however, seal ring extensions (e.g., 364 of FIG. 20) are not included.

Although two wafers are depicted in the wafer stack 690 of FIG. 26, it should be understood that the following description may be applied to wafer stacks including additional wafers, including 3 to 8 wafers, or more. The wafers in FIG. 26 are shown in a face-to-face bonding configuration. It should also be understood that the following description may also be applied to wafers bonded in a face-to-back bonding configuration. That is, the wafer 500 may be turned over, vias (not shown) exposed through the substrate 522, and an interconnect formed there over which is then bonded to the face of the wafer 600.

A lateral offset may be observed between the wafers 500 and 600, similar to that illustrated in and discussed above with respect to FIG. 16a. The offset allows for margin for bonding the wafers 500 and 600 together and other process variations, such as variations in the bond pad or bump patterns.

Figure 27:
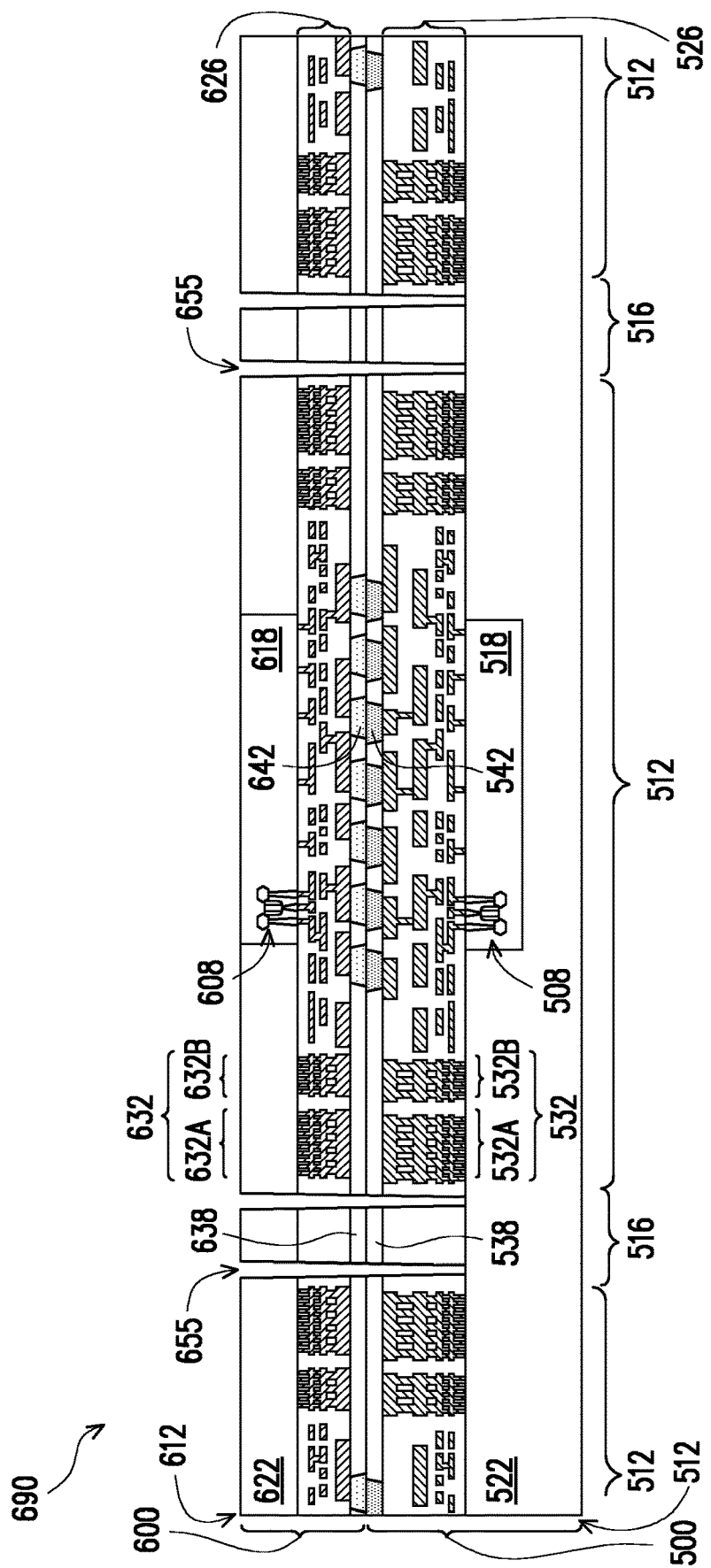

In FIG. 27, the top wafer 600 is thinned to remove excess portions of the substrate 622. The thinning may be performed using any suitable planarization process, such as a grinding process, a chemical mechanical polishing process, an etching process, and so forth, or combinations thereof. In some embodiments, the thinning may expose vias which are formed in the substrate which connect to the interconnect 626. In other embodiments, vias may be formed through the substrate 622 to connect to the interconnect 626 after thinning. Such vias may be formed using any suitable process (e.g., such as the process used to form the openings 655 and fill the openings 655, described below) to etch an opening through the substrate 622 and deposit a metal fill in the opening.

After thinning the top wafer 600, the openings 655 are etched through the wafer 600 and at least partially through the wafer 500, including through the interconnect 526. If additional wafers are interposed between the top wafer 600 and the wafer 500, then the openings 655 are etched through each of the intermediate wafers. In some embodiments, the openings 655 may further extend partially or all the way (e.g., if attached to a carrier (not shown)) through the substrate 522. The openings 655 may be formed using any suitable patterning technique. In some embodiments, a mask is formed over the substrate 622 and patterned to form openings therein corresponding to the openings 655. The openings of the mask are then transferred to each of the layers of the wafer stack 690 through a dry etch process, such as by a reactive ion etch or a plasma etch. The mask used may include multiple layers. By thinning the top wafer 600 prior to forming the openings 655, the aspect ratio of the openings 655 may be improved.

The openings 655 include a trench that circumnavigates the periphery of the die 512 and the die 612. As indicated in FIG. 27, the openings 655 may be positioned outside the seal ring structures 532 and 632. In some embodiments, the openings 655 may be positioned between seal ring structures 532A and 532B and between seal ring structures 632A and 632B. In other embodiments, the openings 655 may be positioned between the seal ring structures 532 and the bond pads 542 and between the seal ring structures 632 and the bond pads 642. In some embodiments, a combination of these placements may occur.

Figure 28:
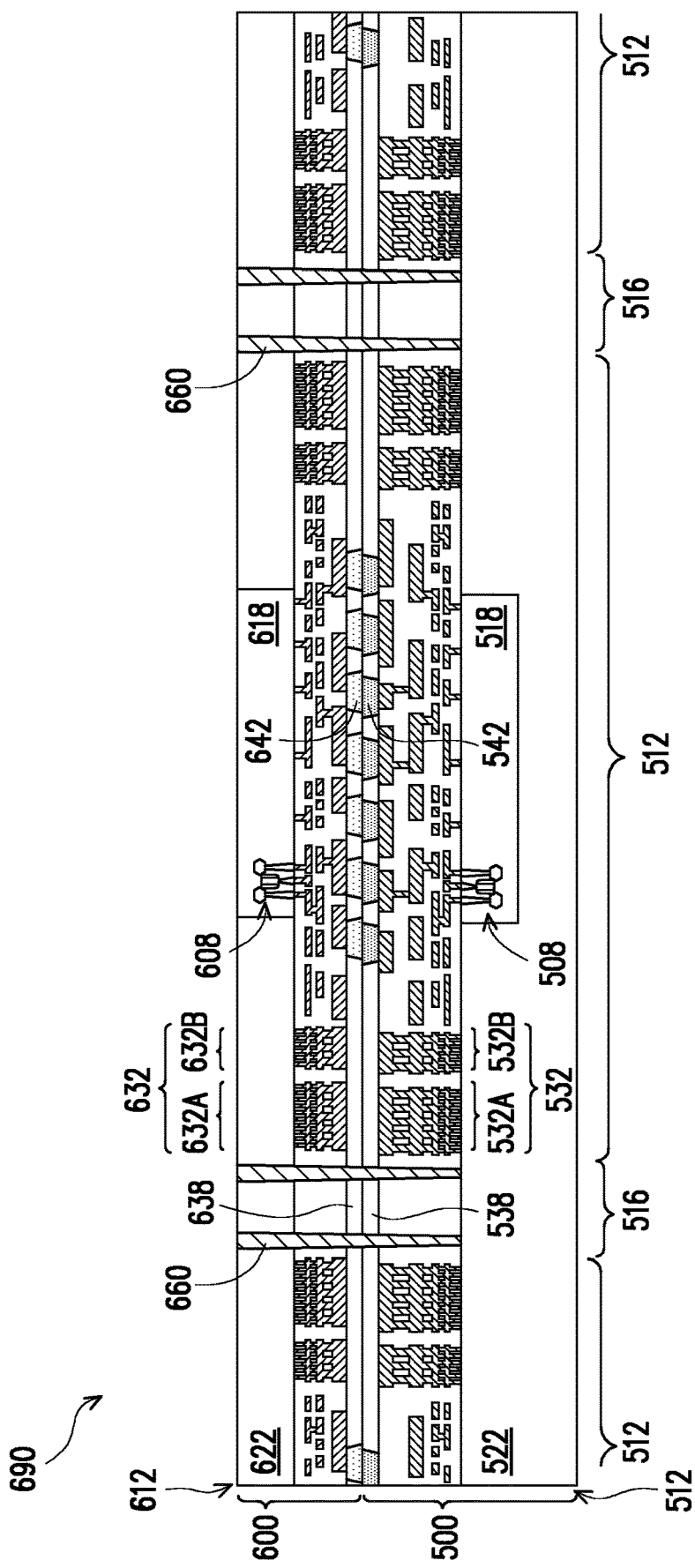

In FIG. 28, extended seal ring structures 660 are formed by depositing a fill material in the openings 655. In some embodiments, the fill material may be a conductive material, such as those discussed above with respect to the bond pad vias 146. In other embodiments, the fill material may be an insulating material, such as a ceramic, nitride, or oxide. The material selected may exhibit resistance to mechanical stress and moisture. The extended seal ring structures 660 may be formed by a suitable deposition process, such as by a PVD, CVD, or plating technique. When the material of the extended seal ring structures 660 is a conductive material, a seed layer and/or barrier layer may be used, such as discussed above with respect to the bond pad vias 146. Upon deposition, the material of the extended seal ring structures 660 may overfill the openings 655, following which a removal process may be performed to remove the excess portions of the material of the extended seal ring structures 660 and to level the upper surfaces of the extended seal ring structures 660 with the (now) upper surface of the substrate 622. The removal process may be any suitable process, such as a grinding process, a CMP process, an etch back process, the like, or any combination thereof.

Figure 29:
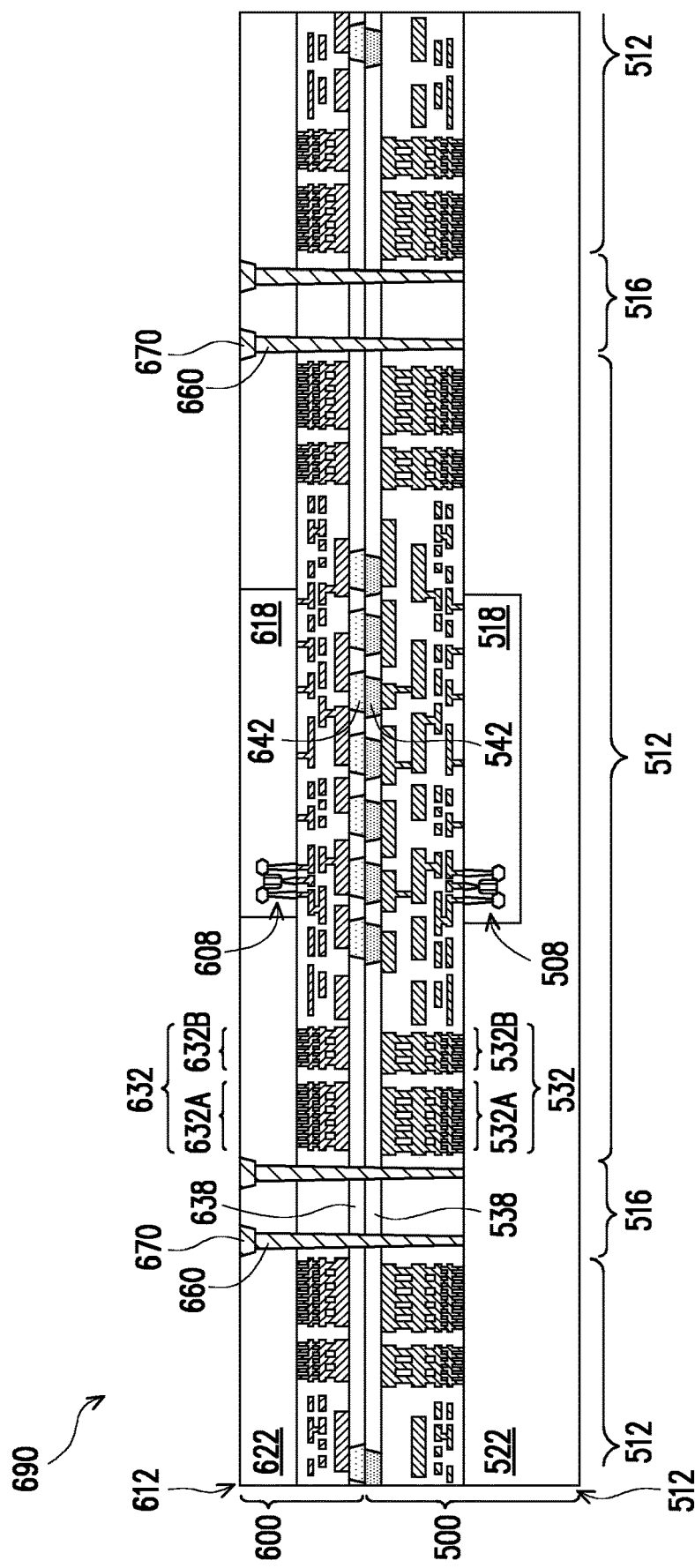

In FIG. 29, optional bond pads 670 may be added to the top of the extended seal ring structures 660. The optional bond pads 670 may be formed using processes and materials similar to those discussed above with respect to the bond pads 142. The bond pads 670 may be used to electrically ground the extended seal ring structure 660.

Figure 30:
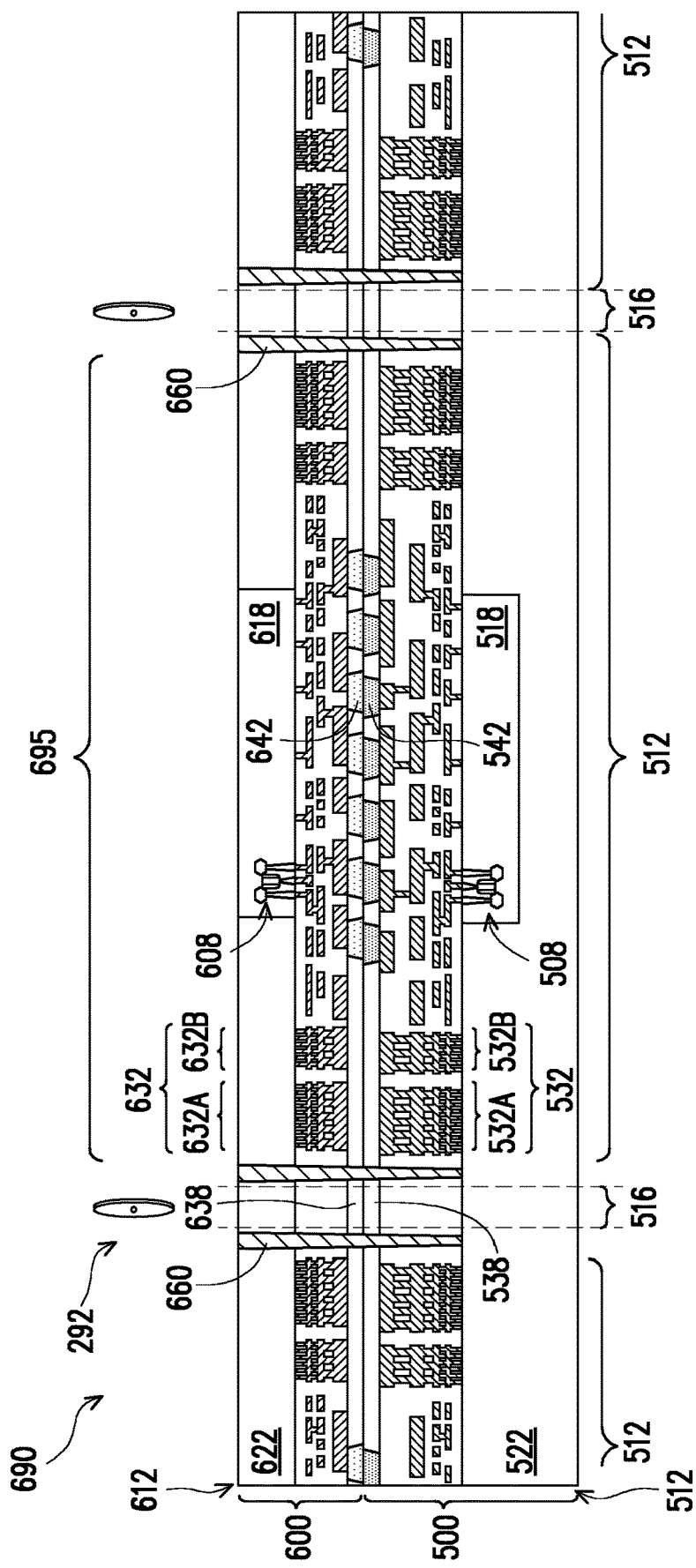

In FIG. 30, the wafer stack 690 is singulated into packages 695. The packages 695 may be singulated using any suitable cutting technique 292, described above.

Figure 31:
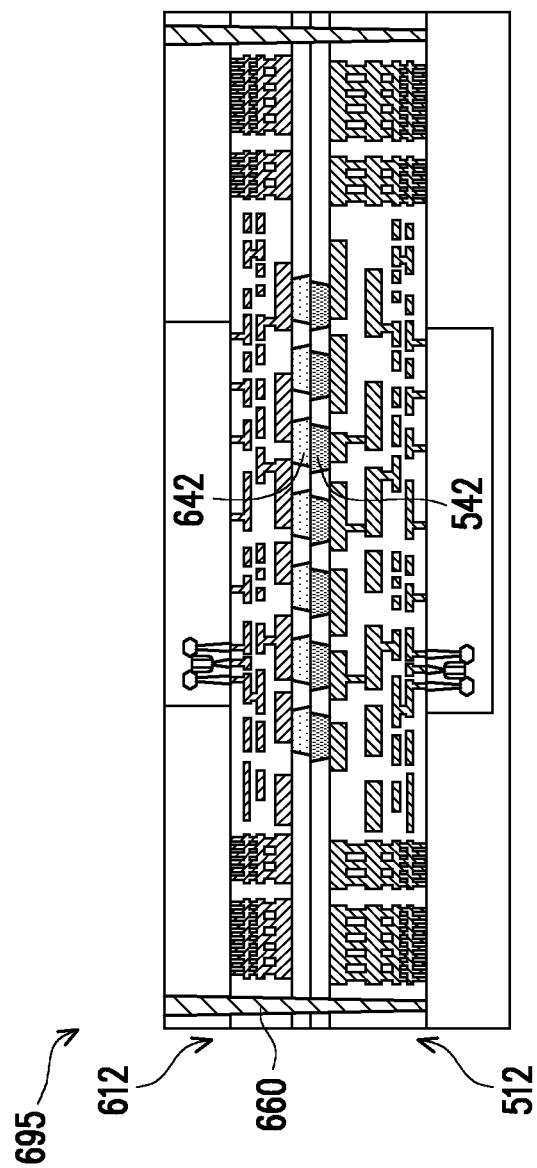

FIG. 31 illustrates the singulated package 695 with extended seal ring structure 660. The extended seal ring structure 660 serves to reduce chipping propagation and keep out humidity and contaminants from penetrating along the bonding interface and/or between the two wafers to affect the bonding of the bond pads 542 and 642.

Figure 32:
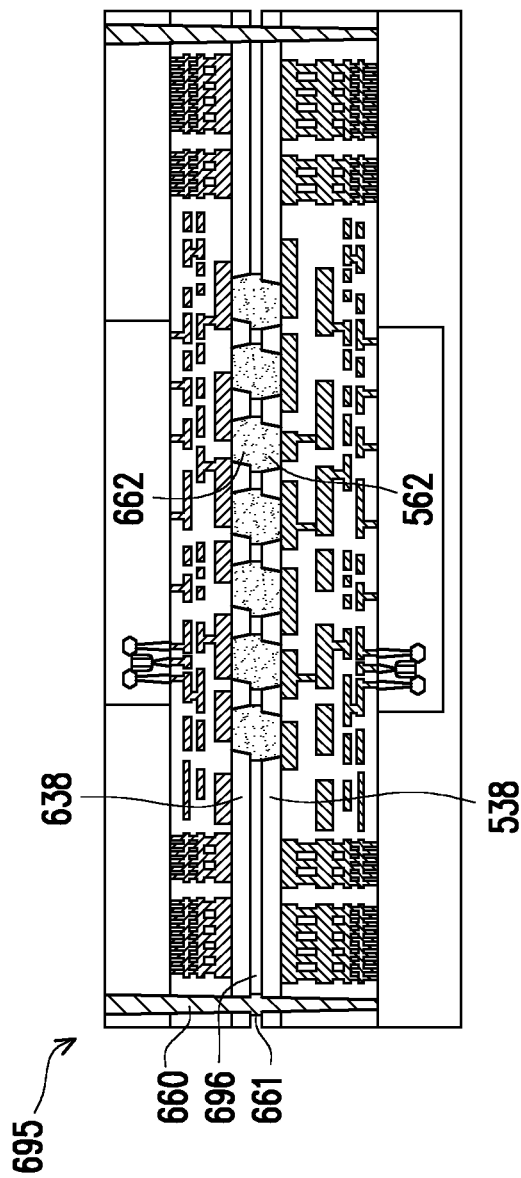

FIG. 32 illustrates an alternative embodiment noted above, where the wafer 500 and wafer 600 are similar to the wafer 300, having bumps 562 and 662, respectively. In the singulated package 695 in FIG. 33, the bumps 562 and 662 are joined together to form a continuous connector from the wafer 600 to the wafer 500 (see FIG. 30). In some embodiments, such as depicted in FIG. 32, an air gap 696 may be enclosed by the extended seal ring structure 660. As seen on the left hand illustration of the extended seal ring structure 660, in such embodiments, a portion of the extended seal ring structure 660 may expand laterally into the air gap 696 between the dielectric layers 538 and 638. In some embodiments, the expanded portion 661 of the extended seal ring structure 660 may extend over the dielectric layer 538. In embodiments where the extended seal ring structure 660 is an insulating material, the expanded portion 661 may extend into the air gap 696 and contact the bumps 562 and/or the bumps 662. In some embodiments, the extended seal ring structure 660 may not appreciably expand laterally into the air gap 696. In some embodiments, an underfill material may be deposited between the wafer 500 and 600 when the openings 655 (see FIG. 27) are made. The underfill material may fill the gaps and surround the connectors between the wafer 500 and 600 in the embodiment illustrated in FIG. 32. In some embodiments, the underfill material may also serve as the extended seal ring structure 660. In other embodiments, the openings 655 may be reformed or finished being formed after the underfill material is applied. The extended seal ring structures 660 serve to reduce chipping propagation and keep out humidity and contaminants from penetrating along the bonding interface and/or between the two wafers to affect the bonding of the bumps 562 and 662.

Figure 33:
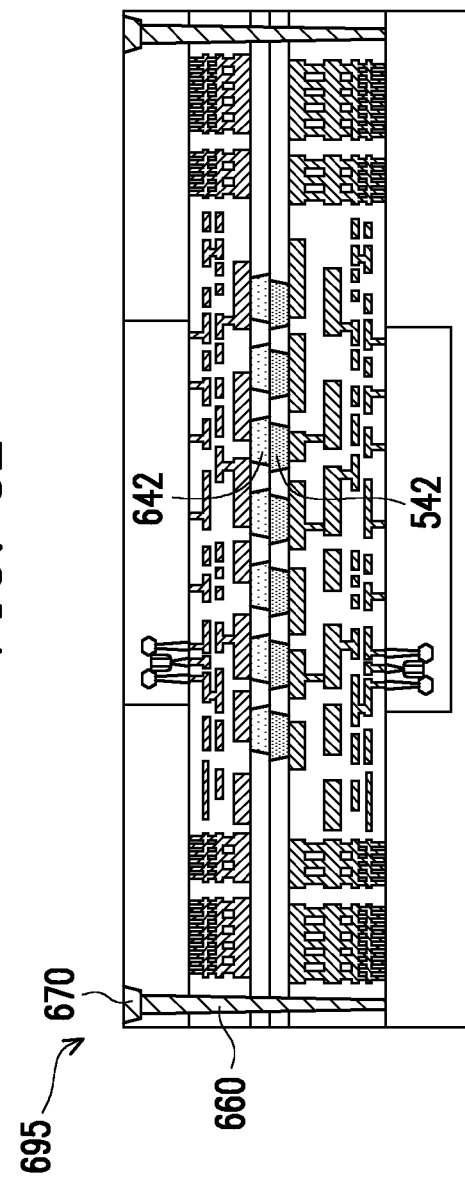

FIG. 33 illustrates an embodiment noted above with respect to FIG. 29, which includes bond pads 670 formed over the extended seal ring structure 660. The bond pads 670 may be used in a subsequently formed package as a grounding point or other purposes.

Figure 34:
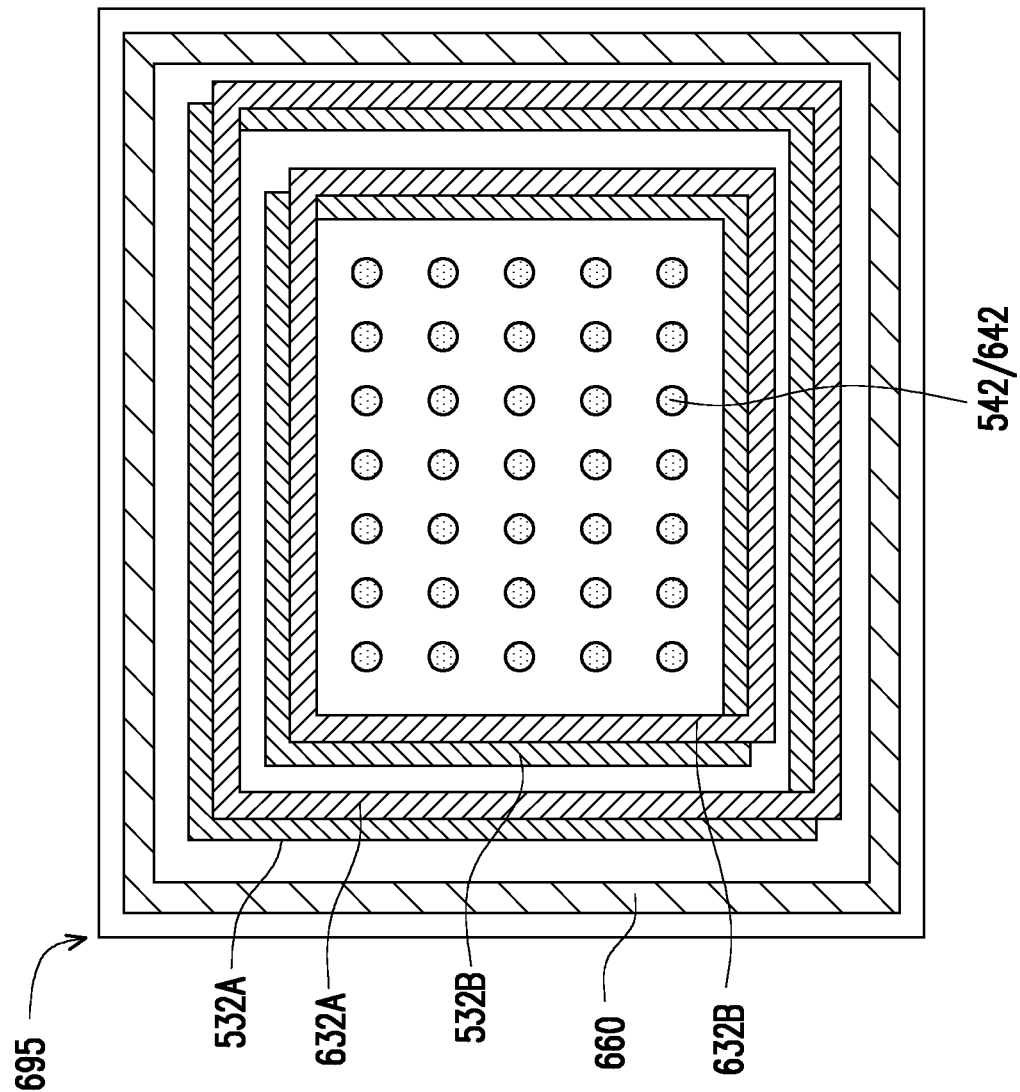

FIG. 34 illustrates a plan view of the package 695. The various illustrated elements may not be visible in the final package, but are illustrated in this view for context. The extended seal ring structure 660 surrounds the merged bond pads 542 and 642 (or bumps 562 and 662, if used). The extended seal ring structure 660 runs with the seal ring structures 532A and 532B around the periphery of the die 512. Similarly, the extended seal ring structure 660 runs with the seal ring structures 632A and 632B around the periphery of the die 612. The shape illustrated is rectangular, but may include any suitable shape, and may have rounded off corners or dog-eared corners, or the like. As noted above, although the extended seal ring structure 660 is depicted as surrounding the seal ring structures 532 and 632, in some embodiments part or all of the seal ring structures 532 may surround the extended seal ring structure 660 instead.

Figure 35:
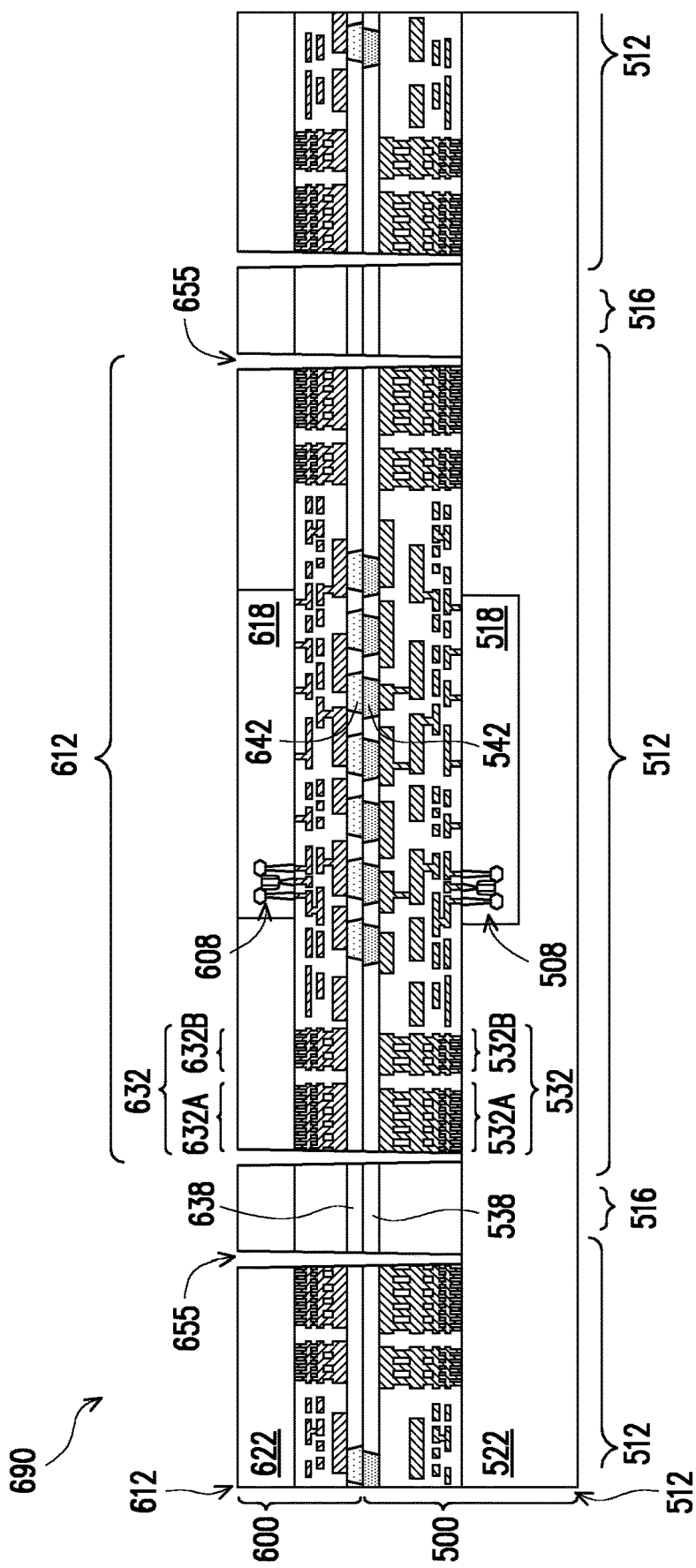

FIGS. 35 through 40 illustrate intermediate views of a process of forming an extended seal ring structure 660 (see FIG. 36) extending through a wafer stack 690, in accordance with some embodiments. FIG. 35 illustrates a wafer stack 690 including wafer 500 bonded to wafer 600. One or more intermediate wafers may be interposed between the wafer 500 and the wafer 600. The wafer stack 690 may be similar to the wafer stack 690 discussed above with respect to FIGS. 26 through 34, with like references referring to like elements.

In FIG. 35, the substrate of wafer 600 is thinned using processes and materials similar to those discussed above with respect to FIG. 27. Next, openings 655 are formed through the wafer 600 and at least partially through the wafer 500. In FIG. 35, the seal ring structures 532 and 632 are at least partially exposed in the forming of the openings 655. In forming the openings 655, the seal ring structures 532 may remain and overhang into the openings 655 or may be partially removed by the process used to create the openings 655.

Figure 36:
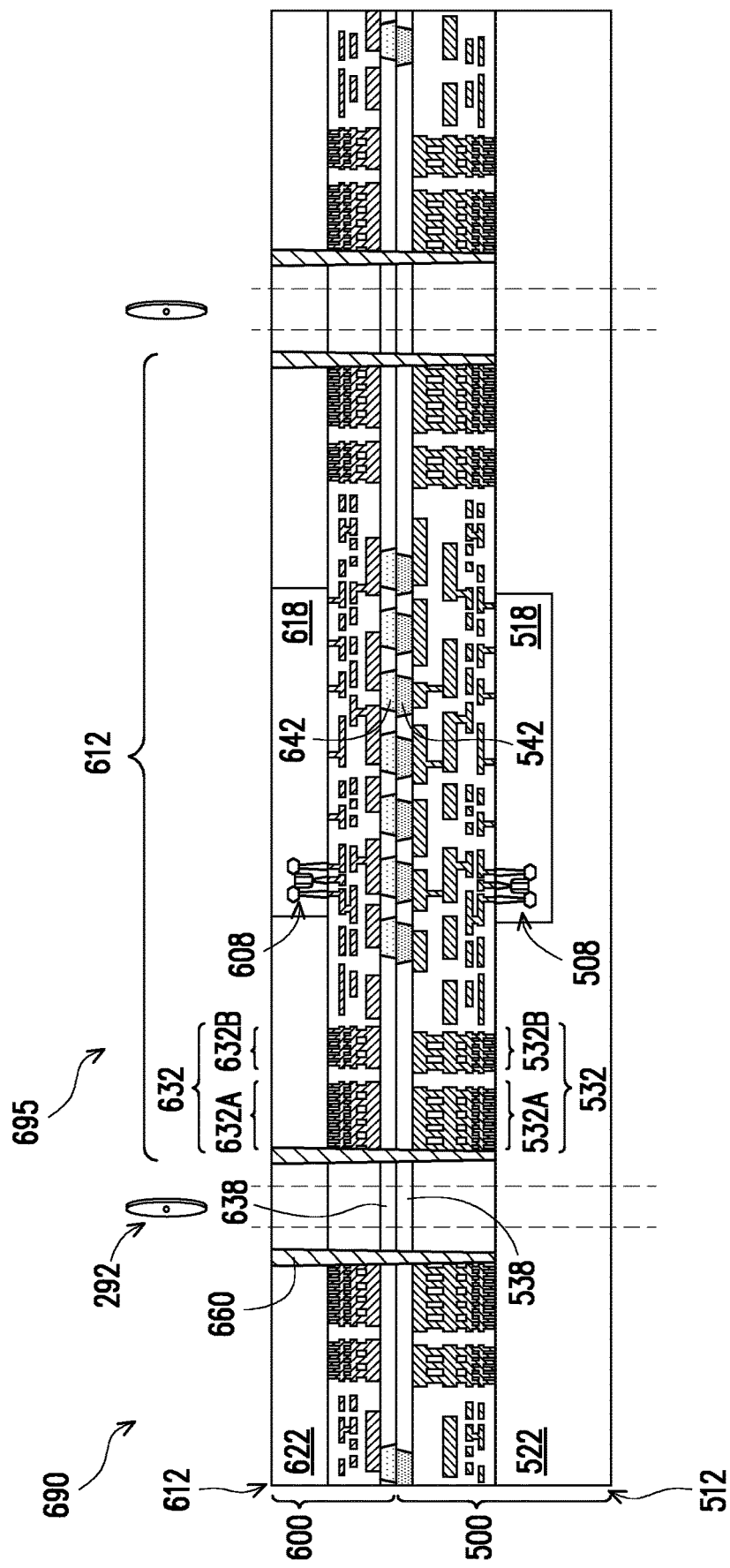

In FIG. 36, a fill material is deposited to form the extended seal ring structures 660. The fill material may be deposited using processes and materials similar to those discussed above with respect to FIG. 28. When the fill material is formed in the openings 655, the fill material contacts the seal ring structures 532 and 632, e.g., 532A and 632A. When the fill material is a conductive material, the extended seal ring structures 660 are electrically coupled to the seal ring structures 532 and 632. In some embodiments, these elements may be electrically grounded and may therefore serve as ground points.

FIG. 36 also illustrates the singulation of the wafer stack 690 into packages 695. The singulation may be performed by any suitable singulation process, such as the cutting technique 292 discussed above, with respect to, for example, FIG. 30.

In FIG. 37, one embodiment of the package 695 includes bond pads 542 and 642 directly bonded to each other in a metal-to-metal bond as well as the dielectric layers 538 and 638 fusion bonded to each other. The extended seal ring structure 660 contacts the seal ring structures 532 and 632, and penetrates all the way through the wafer 600 and at least partially through the wafer 500.

In FIG. 38, one embodiment of the package 695 includes bumps 562 and 662, which are merged together upon reflow. The resulting package 695 may have an air gap 696 between the two dies. The extended seal ring structure 660 seals the air gap 696 against unwanted moisture intrusion so that no underfill between the two dies is necessary. In some embodiments, a portion 661 of the extended seal ring structure 660 may expand laterally into the air gap 696, such as discussed above. In some embodiments, an underfill material may be deposited between the wafer 500 and 600 when the openings 655 (see FIG. 35) are made. The underfill material may fill the gaps and surround the connectors between the wafer 500 and 600 in the embodiment illustrated in FIG. 38. In some embodiments, the underfill material may also serve as the extended seal ring structure 660. In other embodiments, the openings 655 may be reformed or finished being formed after the underfill material is applied.

Figure 39:
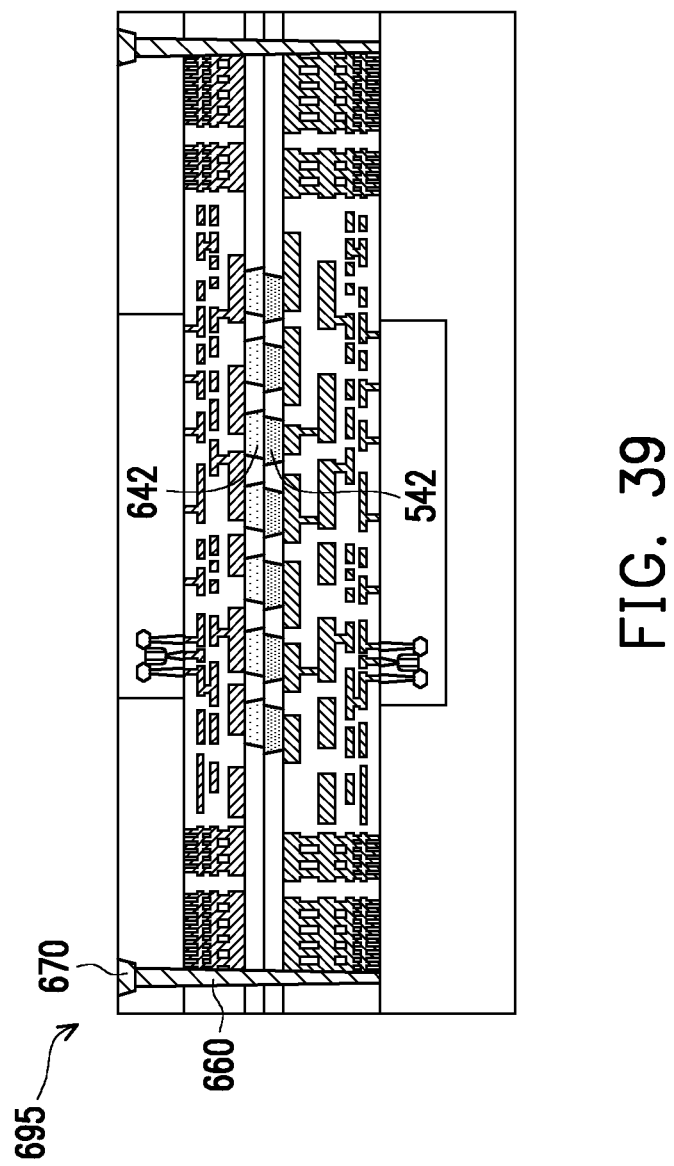

In FIG. 39, one embodiment of the package 695 includes optional bond pads 670 formed over the extended seal ring structure 660. The bond pads 670 may be used in a subsequently formed package as a grounding point or for other purposes.

Figure 40:
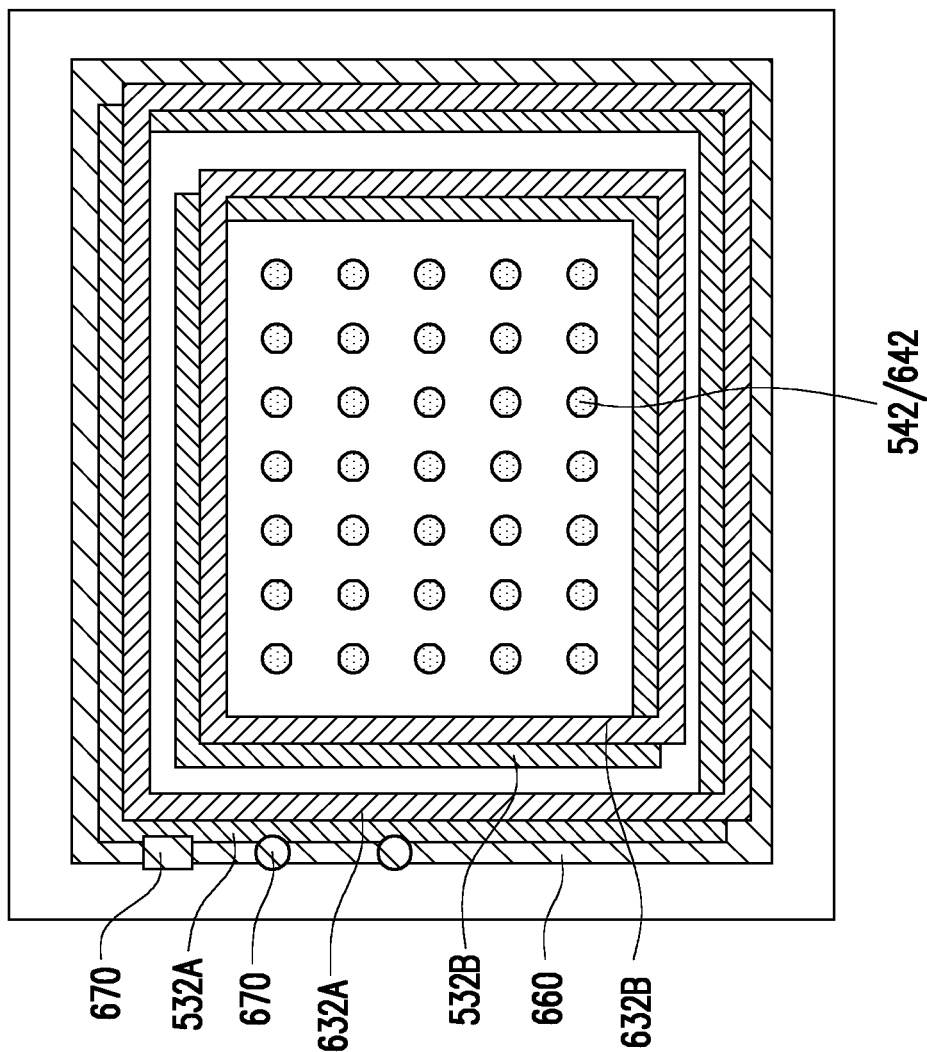

FIG. 40 illustrates a plan view of the package 695, in accordance with some embodiments. The various illustrated elements may not be visible in the final package, but are illustrated in this view for context. The extended seal ring structure 660 surrounds the merged bond pads 542 and 642 (or bumps 562 and 662, if used). The extended seal ring structure 660 runs with the seal ring structures 532A and 532B around the periphery of the die 512 and contacts one or more of the seal ring structures 532A and 532B. Similarly, the extended seal ring structure 660 runs with the seal ring structures 632A and 632B around the periphery of the die 612 and contacts one or more of the seal ring structures 632A and 632B. The shape illustrated is rectangular, but may include any suitable shape, and may have rounded off corners or dog-eared corners, or the like. Although the extended seal ring structure 660 is depicted as surrounding the seal ring structures 532 and 632, in some embodiments part or all of the seal ring structures 532 may surround the extended seal ring structure 660 instead.

FIG. 40 also illustrates a top view of the optional bond pads 670 which are formed on the extended seal ring structure 660, in accordance with embodiments which utilize any of the extended seal ring structures 660 discussed above. As seen in FIG. 40, the bond pads 670 may be circular pads, rectangular pads, or the like. In some embodiments, the bond pads 670 may extend along the entire length of the extended seal ring structure 660 and form a continuous ring.

Figure 41:
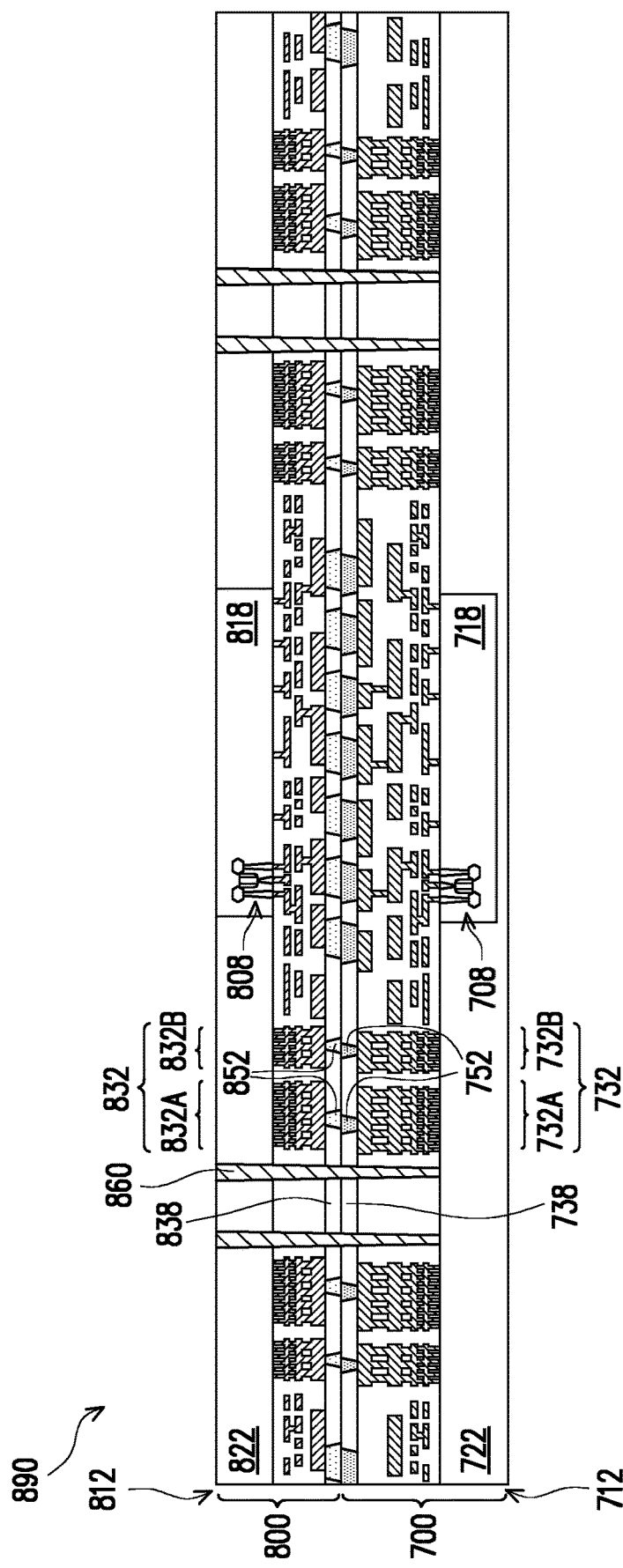
FIGS. 41 through 47 illustrate various views of seal ring extensions through a wafer stack and device package, in accordance with some embodiments.

FIGS. 41 through 47 illustrate a combination of features of the previously illustrated embodiments, in accordance with some embodiments. FIG. 41 illustrates a wafer stack 890 including wafer 700 bonded to wafer 800. In some embodiments, wafers 700 and 800 are each similar to the wafer 100 with like references referring to like elements, except that the leading 1 is replaced by a 7 and 8, respectively. In addition to the seal ring extensions 752 and 852, wafers 700 and 800 also include extended seal ring structures 860 (see extended seal ring structures 660, above). The various illustrated elements may be formed using materials and processes discussed above with respect to their corresponding element.

Figure 42:
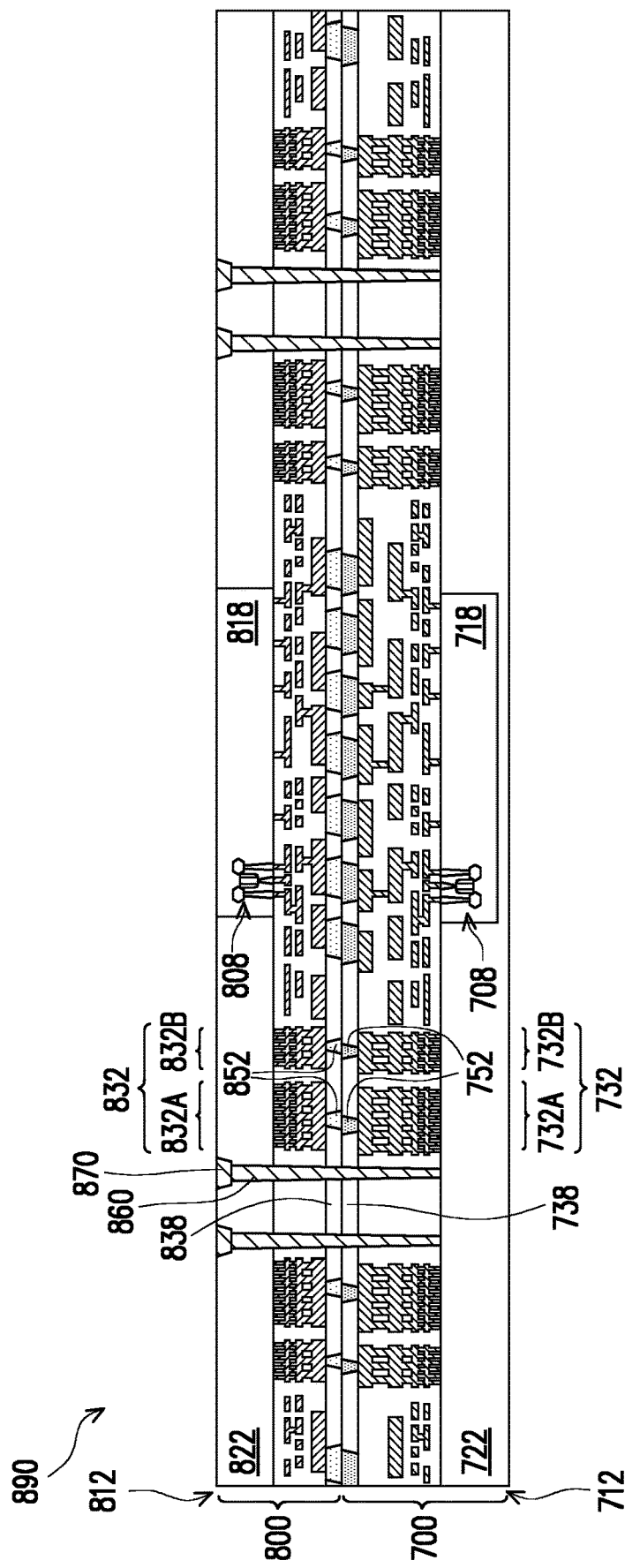
Figure 43:
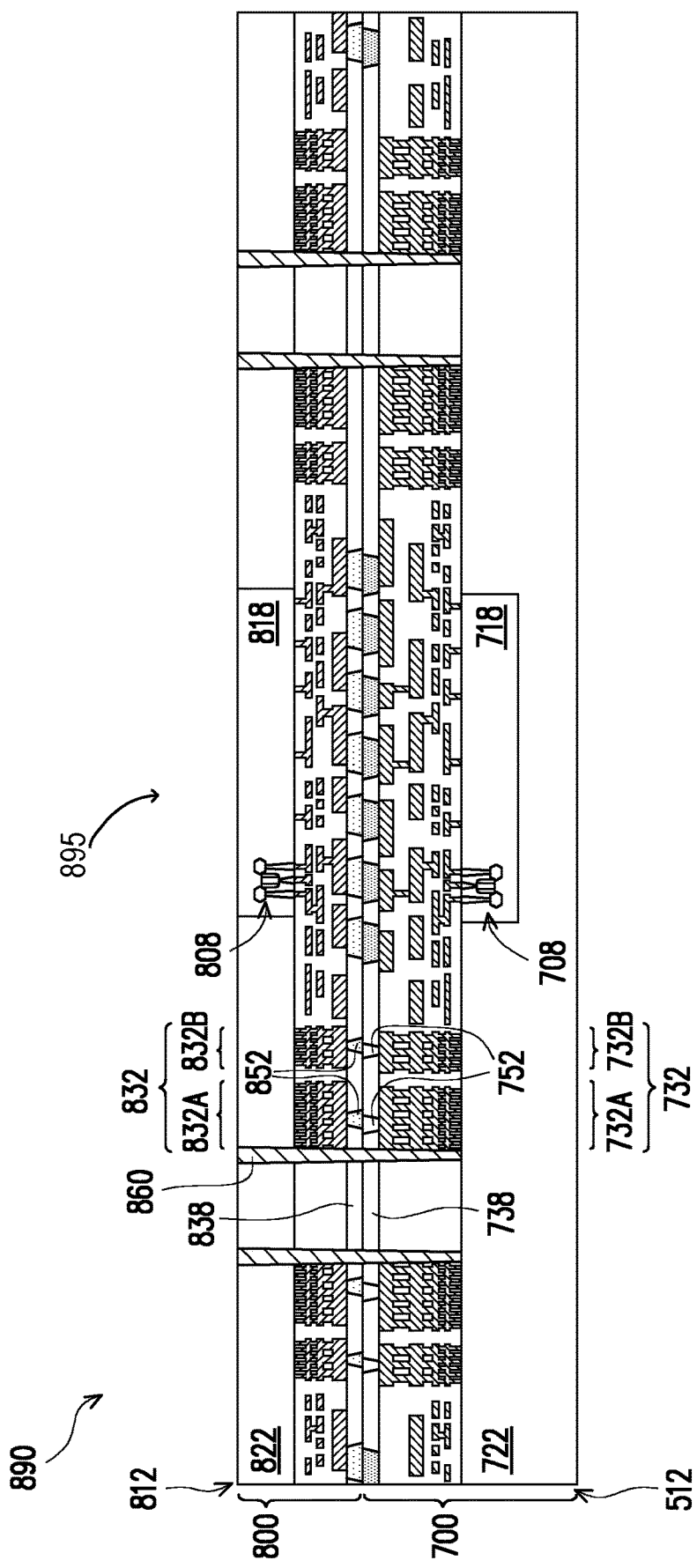

In FIG. 42, the optional bond pads 870 (see bond pads 670, above) are formed over the extended seal ring structures 860. In FIG. 43, the extended seal ring structures 860 are formed such that they contact the seal ring structures 732 and 832 in each of the wafers 700 and 800, respectively. The optional bond pads 870 may also be included in this embodiment as well. The extended seal ring structures 860 which contact the seal ring structures 832 and the extended seal ring structures 860 which do not contact the seal ring structures 832 may both be included in an embodiment, including both at the same side of the package 895, and may or may not be made of the same materials.

Figure 44:
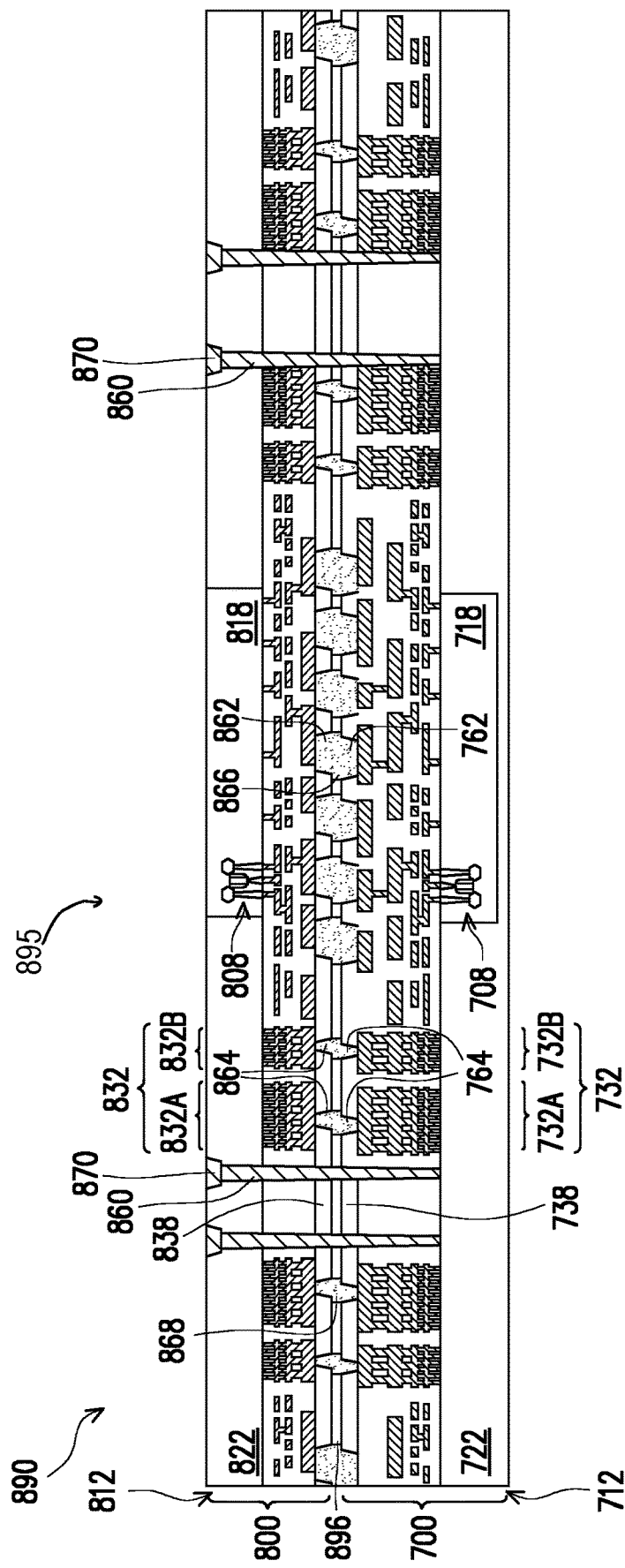

In FIG. 44, each of the wafers 700 and 800 correspond to the wafer 300, discussed above, with like references referring to like elements, except that the leading 3 is replaced with a 6 for the wafer 600 and a 7 for the wafer 700. The wafer stack 890 includes seal ring extensions 868 which are made of the bumps 864 bonded to the bumps 764. In addition, the wafer stack 890 includes extended seal ring structures 860, which may be similar to those discussed above with respect to FIG. 32 or FIG. 37. The optional bond pads 870 are included, but may be omitted. The left side extended seal ring structures do not contact the seal ring structures 732 and 832, such as discussed above with respect to FIG. 32, however the right side extended seal ring structures 860 are illustrated as contacting the seal ring structures 832, such as discussed above with respect to FIG. 37. The extended seal ring structures 860 which contact the seal ring structures 832 and the extended seal ring structures 860 which do not contact the seal ring structures 832 may both be included in the same embodiment, including both at the same side of the package 895, and may or may not be made of the same materials. The embodiment illustrated in FIG. 44 also includes a gap 896 which may have underfill deposited therein, such as described above with respect to the gap 696 of FIG. 32 or of FIG. 38.

Figure 45:
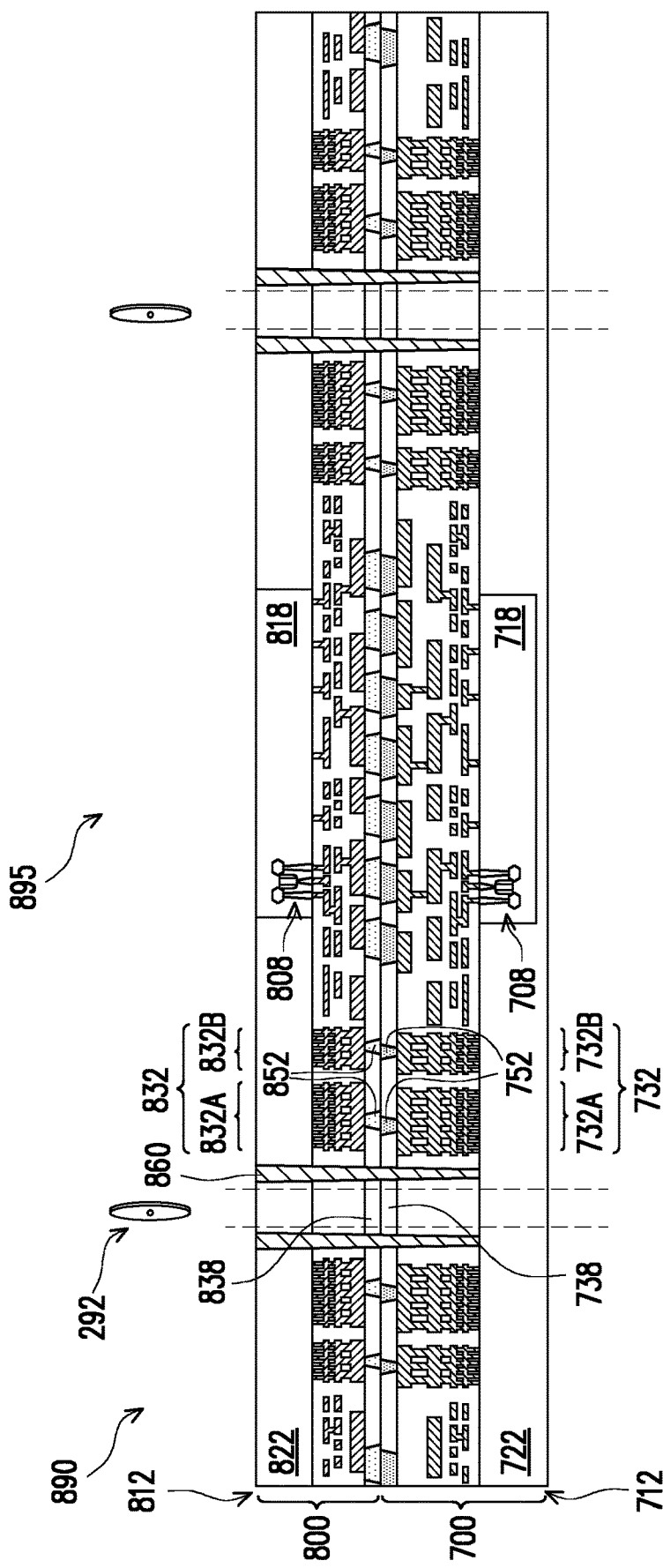

In FIG. 45, taking the wafer stack 890 of FIG. 41 as representative, the wafer stack 890 is singulated to form packages 895. The singulation process may use a cutting technique 292 for cutting the wafer stack 890 into packages 895. The cutting technique 292 may be any of those previously discussed (see, e.g., FIG. 17).

Figure 46:
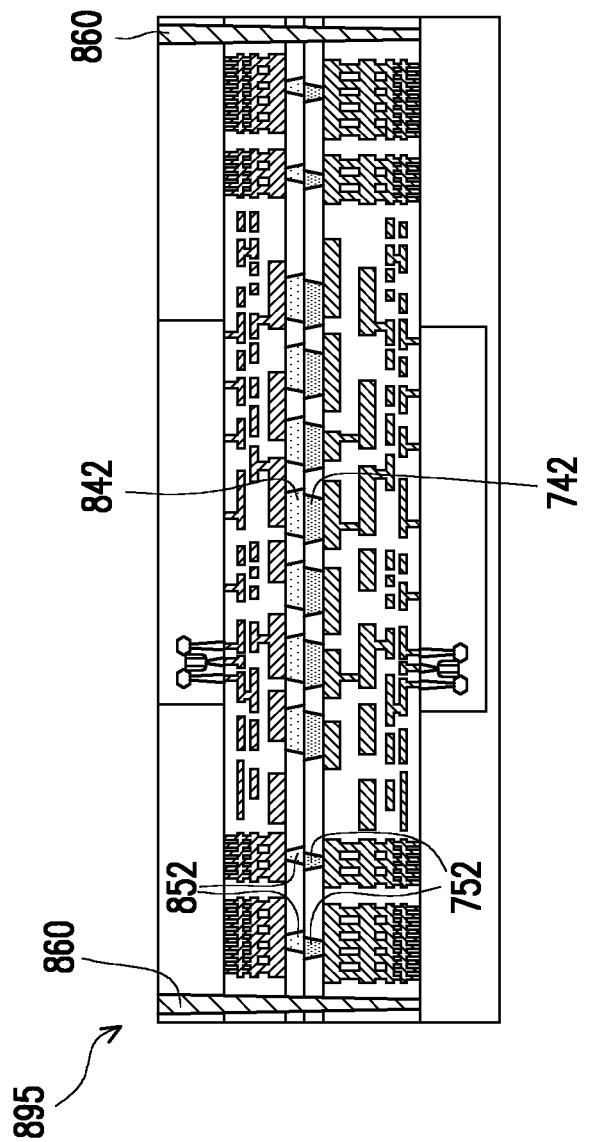

In FIG. 46, the package 895 includes an extended seal ring structure 860 in addition to seal ring extensions 752 and 852. Utilizing both the extended seal ring structure 860 and one or more seal ring extensions 752 and 852 provides enhanced protection against chipping propagation and humidity or environment contamination of the bonds between bond pads 742 and 842 (or bumps 762 and 862 of FIG. 44).

Figure 47:
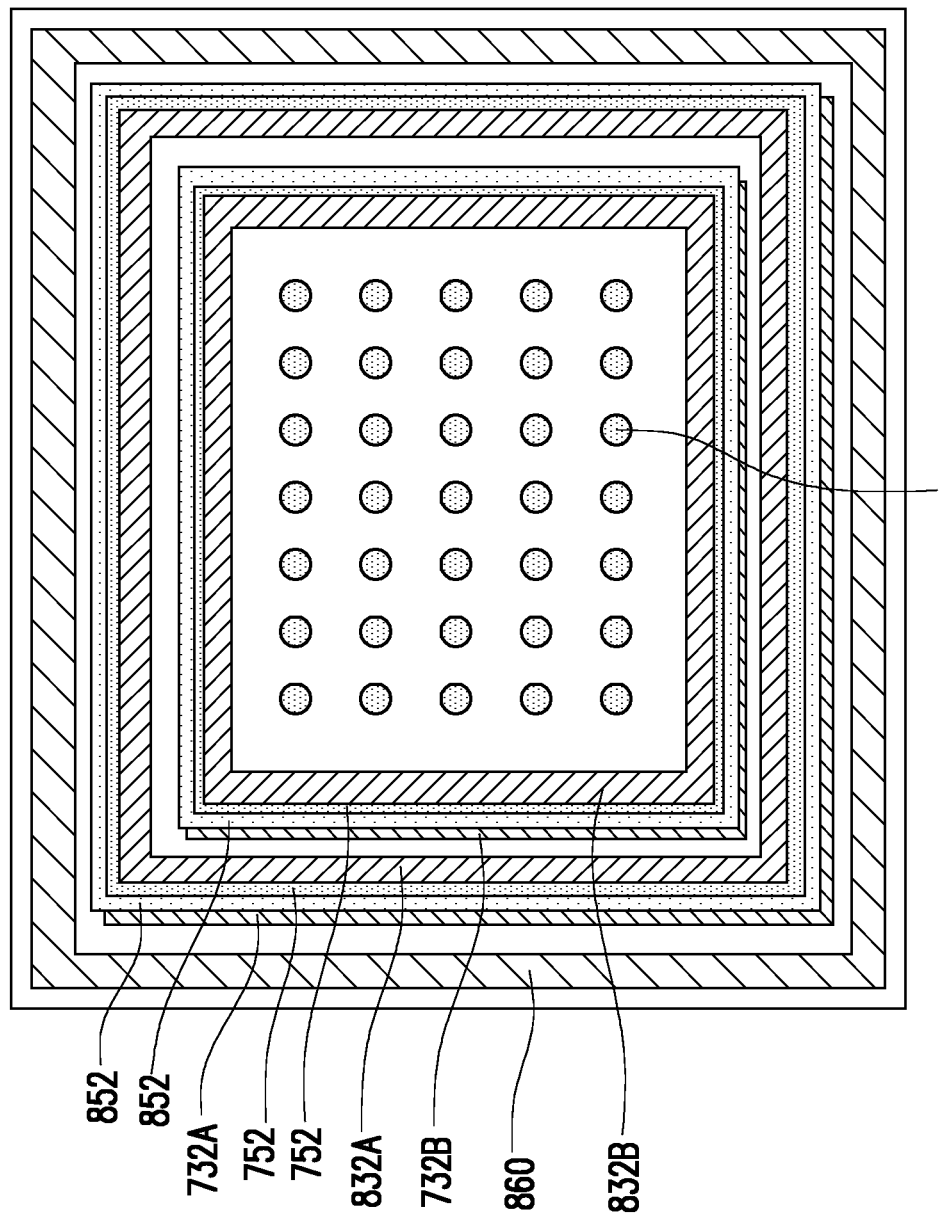

FIG. 47 illustrates a plan view of the package 895, in accordance with some embodiments. The various illustrated elements may not be visible in the final package, but are illustrated in this view for context. The extended seal ring structure 860 surrounds the bond pads 742 and 842 (or bumps 762 and 862, if used). The extended seal ring structure 860 runs alongside the seal ring structures 732A and 732B around the periphery of the die 712. The extended seal ring structure 860 may contact one or more of the seal ring structures 732A and 732B. Similarly, the extended seal ring structure 860 runs alongside the seal ring structures 832A and 832B around the periphery of the die 812 and may also contact one or more of the seal ring structures 832A and 832B. The shape illustrated is rectangular, but may include any suitable shape, and may have rounded off corners or dog-eared corners, or the like. Although the extended seal ring structure 860 is depicted as surrounding the seal ring structures 732 and 832, in some embodiments part or all of the seal ring structures 732 may surround the extended seal ring structure 860 instead.

The seal ring extensions 752 and 852 respectively surround the bond pads 742 and 842 and are formed on the seal ring structures 732 and 832 of each of the wafer 700 and the wafer 800.

Figure 48:
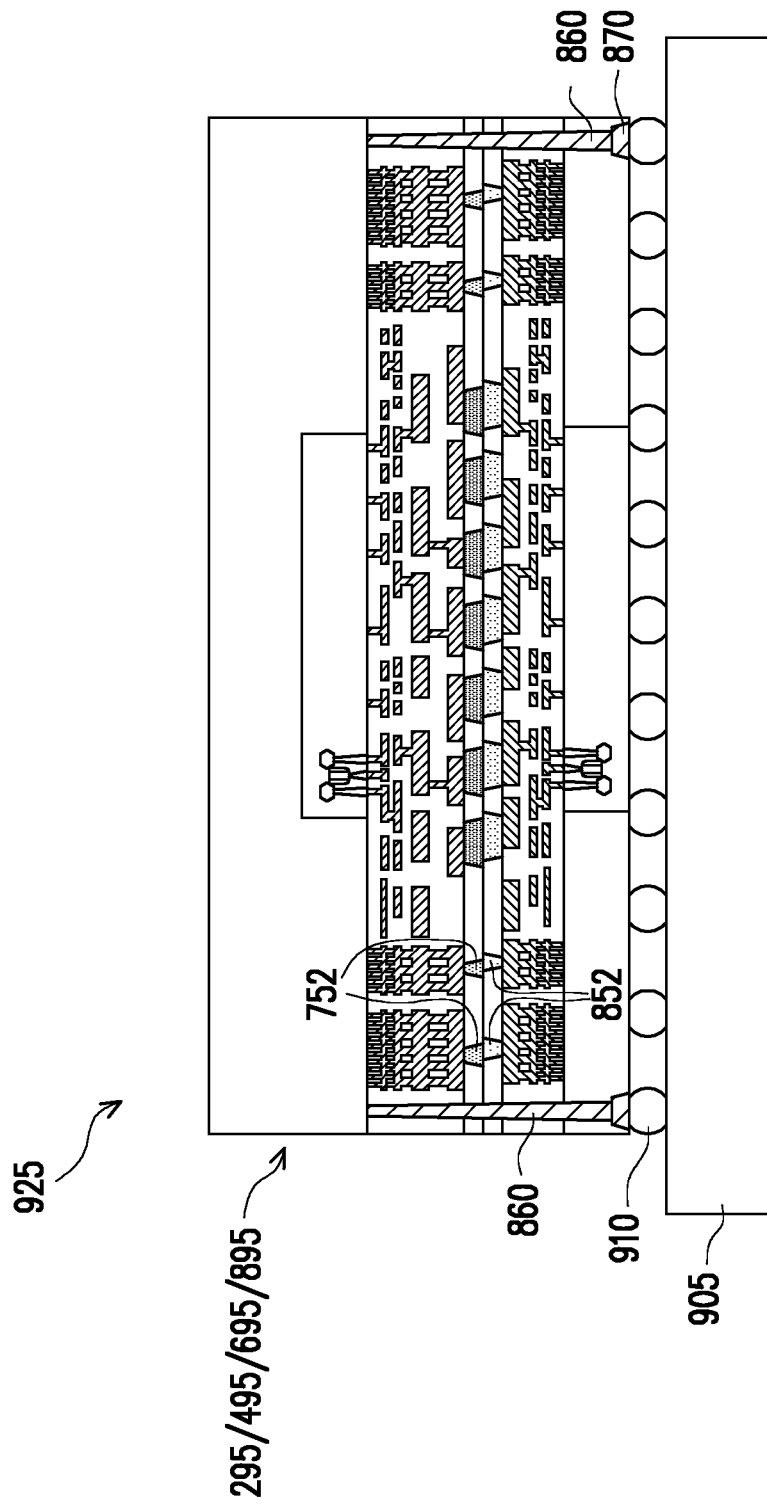
FIG. 48 illustrates a device package incorporated in different device configurations, in accordance with some embodiments.
Figure 49:
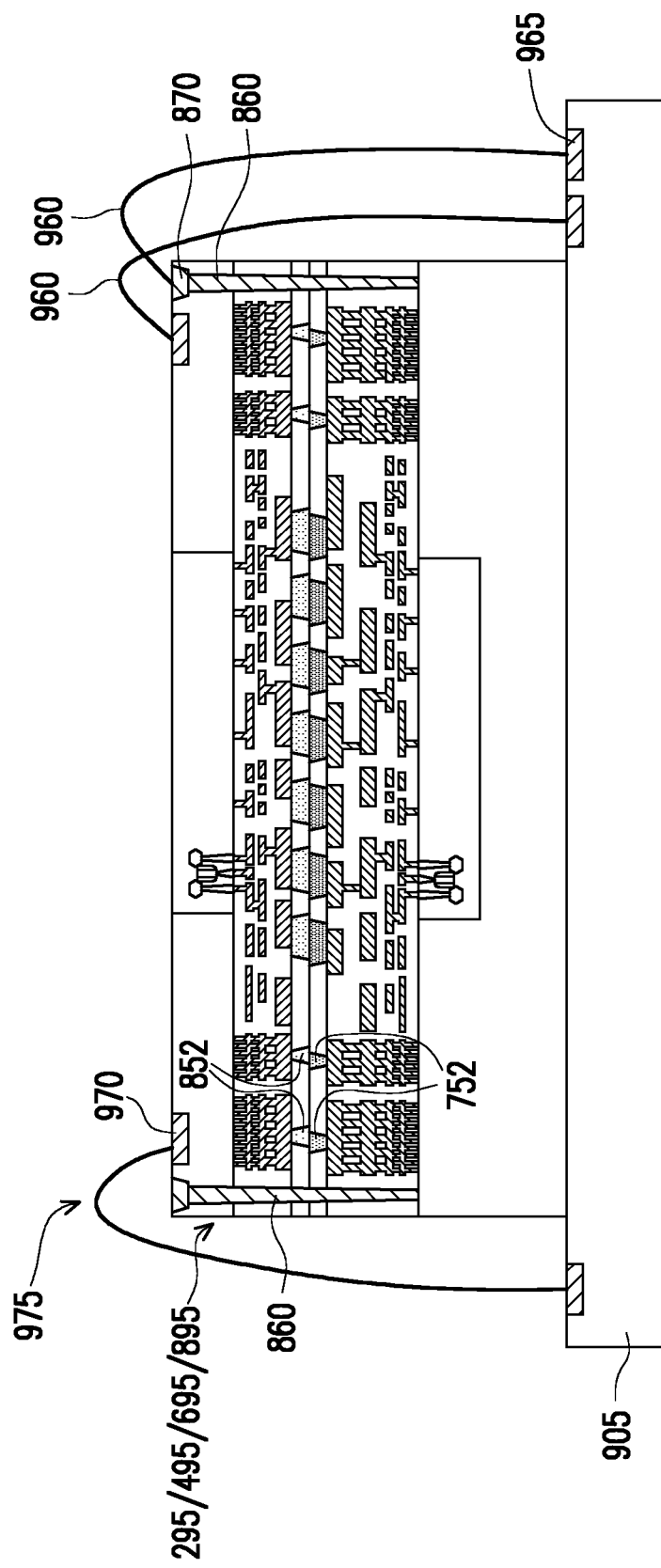
FIG. 49 illustrates a device package incorporated in different device configurations, in accordance with some embodiments.

FIGS. 48 and 49 illustrate package devices which utilize a package 295/495/695/895 as disclosed herein to attach to another device or structure 905 such as a printed circuit board, a system on integrated chip package, a chip on wafer on substrate configuration, or an integrated fan out package. In FIG. 48, the package 295/495/695/895 may have front connectors 910 formed thereon which connect to one or more devices in the package 295/495/695/895. Then, the package 295/495/695/895 may be flipped over and bonded to the structure 905 by the connectors 910 to form a package device 925. In some embodiments, the front connectors 910 may electrically couple an extended seal ring structure 860 to the structure 905.

In FIG. 49, the package 295/495/695/895 may have pads 970 formed on the top surface and connected to one or more devices within the package 295/495/695/895. Then the package may be adhered to the structure 905. Wire bonds 960 may be used to couple the pads 970 with pads 965 formed in the structure 905. In some embodiments, wire bonds 960 may be used to electrically couple an extended seal ring structure 860 to the structure 905.

Seal rings are used to provide structural support and mechanical support against stress from warping and peeling. When a wafer is bonded to another wafer, each seal ring generally functions separately. Some embodiments of the current disclosure advantageously extend the seal ring of the wafer to the bonding surface, and bond the seal ring of one wafer to a seal ring of another wafer when the wafers are bonded together in a wafer-to-wafer bonding. This extended seal ring has the advantage of providing strong stress handling ability between the two wafers, to resist peeling of the wafers from warpage. This extended seal ring also has the advantage of fully sealing the bonding interface between the two wafers where active connectors are bonded together. The risk of humidity and contaminant infiltration is greatly reduced, providing a more robust and resilient device with less chance of failure. At the same time, cost saving wafer-to-wafer bonding processes may still be used for bulk item production because absolute precision is not required, the seal rings able to tolerate a slight offset or misalignment. Some embodiments of the current disclosure advantageously form an extended seal ring structure after the wafer-to-wafer bonding, the extended seal ring structure forming a trench through upper wafer(s) and through all the bonding interfaces and filling the trench with a seal ring material. The extended seal ring structure serves to keep out contaminants and humidity from penetrating the bonding interface, and further enhances the mechanical stability of the wafer stack (and resulting die stack after singulation) to resist stress from warpage. Because the extended seal ring structure is formed after wafer-to-wafer bonding, misalignment is a non-issue for the extended seal ring structure. In some embodiments, the extended seal ring structure may physically and electrically be connected to the seal rings of each of the wafers. Embodiments may also include bond pads over the extended seal ring structure which may be used for grounding.

One embodiment is a package device including a first die including a first seal ring structure disposed around a periphery of the first die in a first interconnect of the first die, a first dielectric layer over the first interconnect, and a first seal ring extension disposed in the first dielectric layer. The first seal ring extension is aligned with and physically coupled to the first seal ring structure, and the first seal ring extension extends continuously around the periphery of the first die. The package device also includes a second die including a second dielectric layer disposed under a second interconnect and a second seal ring extension disposed in the second dielectric layer. The second seal ring extension is aligned with and physically coupled to the first seal ring extension. In an embodiment, the first seal ring extension and the second seal ring extension are physically coupled by a direct metal-to-metal bond without a eutectic material formed there between. In an embodiment, an air gap between the first die and the second die is sealed by the coupled first seal ring extension and second seal ring extension. In an embodiment, the first seal ring extension and the second seal ring extension are offset by a lateral distance. In an embodiment, the package device may include a third seal ring extension extending through the second die and into the first die, the third seal ring extension surrounding first connectors of the first die and second connectors of the second die. In an embodiment, the third seal ring extension contacts the first seal ring structure and the second seal ring structure. In an embodiment, the package device may include one or more bond pads disposed at a top surface of the third seal ring extension. In an embodiment, the first seal ring extension has a homogeneous structure extending vertically from a front surface of the first dielectric layer to the first seal ring structure.

Another embodiment is a package device including a first die including a first seal ring surrounding a periphery thereof. The package device also includes a second die including a second seal ring surrounding a periphery thereof. The package device also includes a third seal ring spanning an interface between the first die and the second die, the third seal ring surrounding the interface and sealing the interface within the third seal ring. In an embodiment, the third seal ring is aligned to and contacts the first seal ring and the second seal ring. In an embodiment, the third seal ring extends up through the second die, the second die over the first die. In an embodiment, the third seal ring surrounds the first seal ring and the second seal ring. In an embodiment, the package device may include a fourth seal ring interposed between the first seal ring and the second seal ring, the fourth seal ring spanning the interface between the first die and the second die, the fourth seal ring having an upper surface contacting a lower surface of the second seal ring and a bottom surface contacting an upper surface of the first seal ring.

Another embodiment is a method including bonding first connectors of a first wafer to second connectors of a second wafer. The first wafer may include a first seal ring; the second wafer may include a second seal ring. The method also includes forming a third seal ring surrounding the first connectors and the second connectors, the third seal ring spanning an interface between the first wafer and the second wafer. The method also includes singulating the first wafer and the second wafer to singulate a first package therefrom. In an embodiment, forming the third seal ring may include: forming a first trench opening in a first dielectric layer over the first seal ring, the first trench opening exposing an upper surface of the first seal ring; depositing a conductive material in the first trench opening to form a first seal ring extension; forming a second trench opening in a second dielectric layer over the second seal ring, the second trench opening exposing an upper surface of the second seal ring; depositing the conductive material in the second trench opening to form a second seal ring extension; and at the same time as bonding the first connectors of the first wafer to the second connectors of the second wafer, bonding the first seal ring extension to the second seal ring extension. In an embodiment, the first seal ring extension and the second seal ring extension may include a eutectic material. In an embodiment, the first seal ring extension and the second seal ring extension are bonded together using a direct metal-to-metal bond. In an embodiment, forming the third seal ring may include: thinning the second wafer; forming a trench through the second wafer, the trench penetrating the first wafer, the trench surrounding the first connectors and the second connectors; and filling the trench with a seal ring material. In an embodiment, the seal ring material is a conductive material. In an embodiment, the method may further include forming a bond pad over the third seal ring. In an embodiment, the trench exposes the first seal ring and the second seal ring, the seal ring material electrically and physically coupling the first seal ring and the second seal ring.

Another embodiment is a package structure including a first die including: a first embedded device, a first interconnect over the embedded device, a first seal ring disposed around a periphery of the first interconnect, a first seal ring extension disposed between the first seal ring and a front surface of the first die, and a first connector at the front surface of the first die, the first connector disposed at the same level as the first seal ring extension. The package structure also includes and a second die including: a second embedded device, a second interconnect over the embedded device, a second seal ring disposed around a periphery of the second interconnect, a second seal ring extension disposed between the second seal ring and a front surface of the second die, and a second connector at the front surface of the second die, the second connector disposed at the same level as the second seal ring extension, where the front surface of the first die is bonded to the front surface of the second die, where the first connector is bonded to the second connector, where the first seal ring extension is bonded to the second seal ring extension, where a first lateral offset of the second connector and the first connector is a first percentage of a width of the first connector, where a second lateral offset of the second seal ring extension and the first seal ring extension is a second percentage of a width of the first seal ring extension, where the first percentage is different from the second percentage. In an embodiment, the first connector is a nearest connector to the first seal ring extension, where a smallest distance between the first seal ring extension and the first connector is different than a distance between the first connector and an immediately adjacent third connector of the first die. In an embodiment, the first connector is bonded to the second connector by a eutectic material, where a gap extends between the front of the first die and the front of the second die, where the gap is completely enclosed with the bonded first seal ring extension and second seal ring extension. In an embodiment, the package further including a third seal ring extension spanning from the first die into the second die. In an embodiment, the third seal ring extension contacts a sidewall of the first seal ring or a sidewall of the second seal ring. In an embodiment, the third seal ring spans a gap disposed between the first die and the second die. In an embodiment, the third seal ring expands laterally into the gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package device comprising:
    a first die comprising:
        a first seal ring structure disposed around a periphery of the first die in a first interconnect of the first die,
        a first dielectric layer over the first interconnect, and
        a first seal ring extension disposed in the first dielectric layer, the first seal ring extension having a homogeneous structure with continuously upright sidewalls extending from a first surface of the first dielectric layer to a second surface of the first dielectric layer, the first surface being opposite the second surface, the first seal ring extension aligned with and physically coupled to the first seal ring structure, the first seal ring extension extending continuously around the periphery of the first die; and
    a second die comprising:
        a second dielectric layer disposed under a second interconnect, and
        a second seal ring extension disposed in the second dielectric layer, the second seal ring extension aligned with and physically coupled to the first seal ring extension.

2. The package device of claim 1, wherein the first seal ring extension and the second seal ring extension are physically coupled by a direct metal-to-metal bond without a eutectic material formed therebetween.

3. The package device of claim 1, wherein an air gap between the first die and the second die is sealed by the coupled first seal ring extension and the second seal ring extension.

4. The package device of claim 1, wherein the first seal ring extension and the second seal ring extension are offset by a lateral distance.

5. The package device of claim 1, further comprising a third seal ring extending through the second die and into the first die, the third seal ring surrounding first connectors of the first die and second connectors of the second die.

6. The package device of claim 5, wherein the third seal ring contacts the first seal ring structure.

7. The package device of claim 5, further comprising one or more bond pads disposed at a top surface of the third seal ring.

8. A package device comprising:
    a first die comprising a first seal ring surrounding a periphery thereof;
    a second die comprising a second seal ring surrounding a periphery thereof; and
    a third seal ring spanning an interface between the first die and the second die, the third seal ring surrounding the interface and sealing the interface within the third seal ring, the third seal ring being a homogeneous structure extending through the interface between the first die and the second die, wherein a first horizontal line parallel with the interface intersects the third seal ring and the first seal ring, wherein a second horizontal line parallel with the interface intersects the third seal ring and the second seal ring.

9. The package device of claim 8, wherein the third seal ring is aligned to and contacts the first seal ring and the second seal ring.

10. The package device of claim 9, wherein the third seal ring extends up through the second die, the second die over the first die.

11. The package device of claim 8, wherein the third seal ring laterally surrounds the first seal ring and the second seal ring.

12. The package device of claim 8, wherein the interface includes a gap between the first die and the second die, the gap surrounding solder connectors coupling the first die to the second die, the gap enclosed within the third seal ring.

13. The package device of claim 8, further comprising a fourth seal ring interposed between the first seal ring and the second seal ring, the fourth seal ring spanning the interface between the first die and the second die, the fourth seal ring having an upper surface contacting a lower surface of the second seal ring and a bottom surface contacting an upper surface of the first seal ring.

14. A package structure comprising:
    a first die comprising:
        a first embedded device,
        a first interconnect over the first embedded device,
        a first seal ring disposed around a periphery of the first interconnect,
        a first seal ring extension disposed between the first seal ring and a front surface of the first die, and
        a first connector at the front surface of the first die, the first connector disposed at the same level as the first seal ring extension; and
    a second die comprising:
        a second embedded device,
        a second interconnect over the second embedded device,
        a second seal ring disposed around a periphery of the second interconnect,
        a second seal ring extension disposed between the second seal ring and a front surface of the second die, and
        a second connector at the front surface of the second die, the second connector disposed at the same level as the second seal ring extension,
    wherein the front surface of the first die is bonded to the front surface of the second die, wherein the first connector is bonded to the second connector, wherein the first seal ring extension is bonded to the second seal ring extension, wherein a first lateral offset of the second connector and the first connector is a first percentage of a width of the first connector, wherein a second lateral offset of the second seal ring extension and the first seal ring extension is a second percentage of a width of the first seal ring extension, wherein the first percentage is different from the second percentage.

15. The package structure of claim 14, wherein the first connector is a nearest connector to the first seal ring extension, wherein a smallest distance between the first seal ring extension and the first connector is different than a distance between the first connector and an immediately adjacent third connector of the first die.

16. The package structure of claim 14, wherein the first connector is bonded to the second connector by a eutectic material, wherein a gap extends between the front surface of the first die and the front surface of the second die, wherein the gap is completely enclosed with the bonded first seal ring extension and second seal ring extension.

17. The package structure of claim 14, further comprising a third seal ring spanning from the first die into the second die.

18. The package structure of claim 17, wherein the third seal ring contacts a sidewall of the first seal ring or a sidewall of the second seal ring.

19. The package structure of claim 17, wherein the third seal ring spans a gap disposed between the first die and the second die.

20. The package structure of claim 19, wherein the third seal ring expands laterally into the gap.

* * * * *